United States Patent
Hwang et al.

(10) Patent No.: US 9,881,934 B2
(45) Date of Patent: Jan. 30, 2018

(54) VERTICAL NON-VOLATILE MEMORY DEVICE, METHOD OF FABRICATING THE SAME DEVICE, AND ELECTRIC-ELECTRONIC SYSTEM HAVING THE SAME DEVICE

(71) Applicant: SAMSUNG ELECTRONICS CO., LTD., Suwon-si, Gyeonggi-do (KR)

(72) Inventors: Sung-min Hwang, Seoul (KR);
Han-soo Kim, Gyeonggi-do (KR);
Won-seok Cho, Gyeonggi-do (KR);
Jae-hoon Jang, Gyeonggi-do (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 424 days.

(21) Appl. No.: 14/495,397

(22) Filed: Sep. 24, 2014

(65) Prior Publication Data
US 2015/0011064 A1    Jan. 8, 2015

Related U.S. Application Data

(62) Division of application No. 12/817,793, filed on Jun. 17, 2010, now Pat. No. 8,879,321.

(30) Foreign Application Priority Data

Jul. 6, 2009  (KR) ........................ 10-2009-0061204

(51) Int. Cl.
*H01L 27/115*  (2017.01)
*H01L 21/265*  (2006.01)
(Continued)

(52) U.S. Cl.
CPC ...... *H01L 27/11582* (2013.01); *H01L 21/265* (2013.01); *H01L 21/28518* (2013.01);
(Continued)

(58) Field of Classification Search
CPC ......... H01L 27/11582; H01L 27/11578; H01L 21/265; H01L 21/30604; H01L 21/28518;
(Continued)

(56) References Cited

U.S. PATENT DOCUMENTS

| 6,798,696 B2 | 9/2004 | Matsushita et al. |
| 6,828,622 B2 | 12/2004 | Kitamura et al. |

(Continued)

FOREIGN PATENT DOCUMENTS

| JP | 2000091450 | 3/2000 |
| JP | 2007-180389 | 7/2007 |

(Continued)

OTHER PUBLICATIONS

Official Office Action issued by Korean Industrial Property Office dated Feb. 27, 2015 corresponding to Korean Patent Application No. 10-2009-0061204.

*Primary Examiner* — Seahvosh Nikmanesh
(74) *Attorney, Agent, or Firm* — F. Chau & Associates, LLC

(57) ABSTRACT

Provided is a vertical non-volatile memory device having a metal source line. The vertical non-volatile memory device includes cell string units that are formed on first portions of a semiconductor substrate and are vertically arranged with respect to a surface of the semiconductor substrate, impurity regions formed on second portions of the semiconductor substrate between the cell string units, conductive lines formed on the impurity regions, and spacers that are formed on the sidewalls of the cell string units and insulate the conductive lines from the cells string units.

10 Claims, 36 Drawing Sheets

(51) Int. Cl.
  *H01L 21/285* (2006.01)
  *H01L 21/306* (2006.01)
  *H01L 21/768* (2006.01)
  *H01L 29/66* (2006.01)
  *H01L 27/11582* (2017.01)
  *H01L 27/11578* (2017.01)
  *G11C 16/04* (2006.01)

(52) U.S. Cl.
  CPC ...... *H01L 21/30604* (2013.01); *H01L 21/768* (2013.01); *H01L 27/11578* (2013.01); *H01L 29/6656* (2013.01); *G11C 16/0483* (2013.01)

(58) Field of Classification Search
  CPC . H01L 21/768; H01L 21/268; H01L 29/6656; G11C 16/0483
  See application file for complete search history.

(56) References Cited

U.S. PATENT DOCUMENTS

| | | | |
|---|---|---|---|
| 7,315,474 B2 | 1/2008 | Lue | |
| 7,679,133 B2 | 3/2010 | Son et al. | |
| 7,696,559 B2 | 4/2010 | Arai et al. | |
| 7,829,948 B2 | 11/2010 | Arai et al. | |
| 7,875,922 B2 | 1/2011 | Arai et al. | |
| 7,884,417 B2 | 2/2011 | Mizukami et al. | |
| 7,936,004 B2 | 5/2011 | Kito et al. | |
| 8,008,710 B2 | 8/2011 | Fukuzumi et al. | |
| 8,044,448 B2 | 10/2011 | Kamegaichi et al. | |
| 8,133,734 B2 | 3/2012 | Chung et al. | |
| 8,148,216 B2 | 4/2012 | Arai et al. | |
| 8,236,650 B2 | 8/2012 | Son et al. | |
| 8,492,828 B2 | 7/2013 | Son et al. | |
| 2005/0059212 A1 | 3/2005 | Kitamura et al. | |
| 2007/0158736 A1 | 7/2007 | Arai et al. | |
| 2007/0252201 A1 | 11/2007 | Kito et al. | |
| 2008/0173928 A1 | 7/2008 | Arai et al. | |

FOREIGN PATENT DOCUMENTS

| | | |
|---|---|---|
| JP | 2007-317874 | 12/2007 |
| JP | 2008-159699 | 7/2008 |
| KR | 1020080058251 | 6/2008 |
| KR | 1020090047614 | 5/2009 | ns
VERTICAL NON-VOLATILE MEMORY DEVICE, METHOD OF FABRICATING THE SAME DEVICE, AND ELECTRIC-ELECTRONIC SYSTEM HAVING THE SAME DEVICE

CROSS-REFERENCE TO RELATED APPLICATIONS

This application is a divisional of U.S. application Ser. No. 12/817,793 filed on Jun. 17, 2010, which claims the benefit of Korean Patent Application No. 10-2009-0061204, filed on Jul. 6, 2009, in the Korean Intellectual Property Office, the disclosure of which is incorporated by reference herein in its entirety.

BACKGROUND

The inventive concept relates to a method of fabricating a vertical non-volatile memory device, and more particularly, to a method of fabricating a vertical non-volatile memory device having a metal source line or a metal silicide layer.

A non-volatile memory device retains stored data even when not powered. Such a non-volatile memory device is widely used in computers and memory cards. A conventional non-volatile memory device has a planar structure in which memory cells are horizontally arranged.

Due to limiting factors, such as a design rule, it is difficult to reduce the size and to increase the integration and storage capacity of a planar structure non-volatile memory device.

SUMMARY

A vertical non-volatile memory device having a metal source line is provided, in which the bottom surfaces of gate dielectric layers of selecting transistors formed at the bottom of cell string units are lower than the top surface of the semiconductor substrate in a peripheral region. Provided also is a vertical non-volatile memory device in which metal silicide layers function as a common source line formed below the bottom surface of the gate dielectric layers.

According to an embodiment of the inventive concept, there is provided a vertical non-volatile memory device including cell string units that are formed on first portions of a semiconductor substrate and are vertically arranged with respect to a surface of the semiconductor substrate; impurity regions formed on second portions of the semiconductor substrate between the cell string units; conductive lines formed on the impurity regions; and spacers that are formed on the sidewalls of the cell string units and insulate the conductive lines from the cells string units.

Each of the cell string units may include selecting transistors and a plurality of memory cell transistors arranged between the selecting transistors, channel layers may be formed to contact the first portions and are vertical to the surface of the semiconductor substrate, and the selecting transistors and the plurality of memory cell transistors may be arranged on the sidewalls of the channel layers.

The non-volatile memory device may include insulation pillars, which are formed on the centers of the first portions to be vertical to the surface of the semiconductor substrate, and the cell string units may include channel layers, which surround the bottom surfaces and the sidewalls of the insulation pillars and contact the first portions of the semiconductor substrate; and gates of selecting transistors, which are arranged on the channel layers formed on two opposite sidewalls of each of the insulation pillars and are vertically stacked with respect to the surface of the semiconductor substrate, and gates of memory cell transistors, which are arranged between the gates of the selecting transistors.

The conductive lines may be formed to be located lower than bottom surfaces of the bottommost gates from among the gates of the memory cell transistors.

The spacers may be formed on the entire sidewalls of the cells string units, and the conductive lines may be formed in the entire gaps between the spacers or formed in a part of the gaps between the spacers.

The spacers may be formed on a part of the sidewalls of the cell string units, and the conductive lines may be formed between the spacers.

An insulation layer may be formed on the conductive lines and the spacers.

The vertical non-volatile memory device may further include conductive signal lines on the cell string units.

Each of the impurity regions may include low concentration impurity regions, which are arranged on the second portions below the spacers; and high concentration impurity regions, which are arranged on the second portions between the low concentration impurity regions and have the same conductive type as the low concentration impurity regions.

The vertical non-volatile memory device may further include metal silicide layers formed between the impurity regions and the conductive lines.

The conductive lines may include a metal layer selected from among a tungsten (W) layer, an aluminium (Al) layer, and a copper (Cu) layer.

According to an embodiment of the inventive concept, there is provided a vertical non-volatile memory device including a semiconductor substrate including a cell region and a peripheral region; cell string units, which are formed on first portions within the cell region and are vertically arranged with respect to a surface of the semiconductor substrate; impurity regions formed on second portions between the cell string units within the cell region; and conductive lines formed on the impurity regions, wherein the bottom surfaces of the gate dielectric layers of the bottommost selecting transistors in the cell string units are located lower than the top surface of the semiconductor substrate in the peripheral region.

According to an embodiment of the inventive concept, there is provided an electric-electronic system including an input/output device via which data is input and output; an interface for receiving and transmitting the data; a memory chip having the non-volatile memory chip that stores the data; and a controller for controlling the input/output device, the interface, and the memory chip.

According to an embodiment of the inventive concept, there is provided a method of fabricating a vertical non-volatile memory device, the method including forming first insulation pillars on first portions of a semiconductor substrate to be apart from each other, and forming cell string units on side surfaces of the first insulation pillars; forming impurity region in second portions of the semiconductor substrate between the cell string units; and forming conductive lines on the impurity regions.

According to an embodiment of the inventive concept, there is provided a method of fabricating a vertical non-volatile memory device, the method including defining a cell region and a peripheral region on a semiconductor substrate; forming cell string units on first portions within the cell region to be vertical to the surface of the semiconductor substrate; forming impurity region in second portions between the cell string units within the cell region; and forming conductive lines on the impurity regions, wherein the bottom surfaces of the gate dielectric layers of the bottommost selecting transistors in the cell string units are located lower than the top surface of the semiconductor substrate in the peripheral region.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

Figure 1:
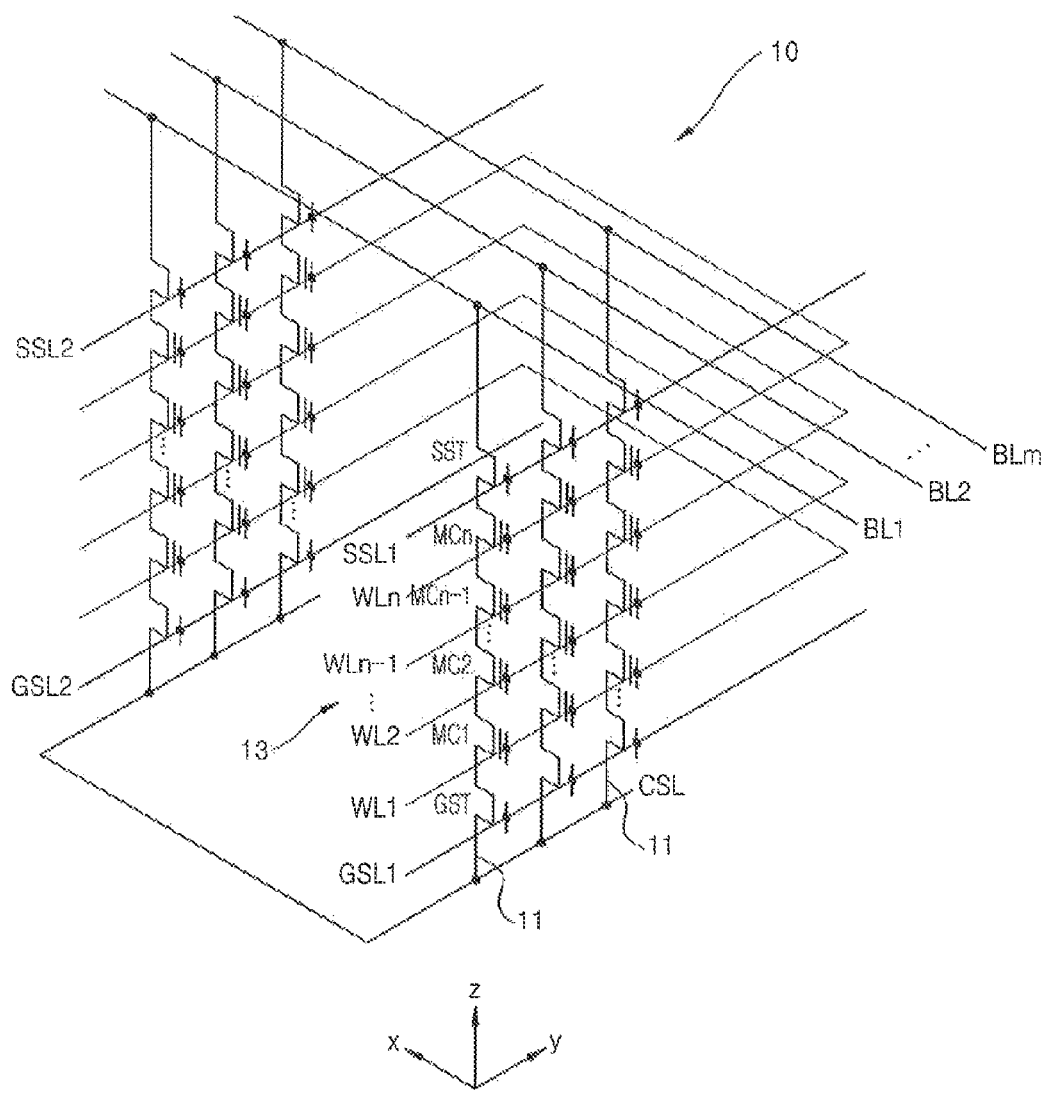
FIG. 1 is a diagram showing a structure of a memory cell array of a vertical non-volatile memory device according to an embodiment of the inventive concept.

The inventive concept will now be described more fully with reference to the accompanying drawings, in which exemplary embodiments of the inventive concept are shown. The inventive concept may, however, be embodied in many different forms and should not be construed as being limited to the embodiments set forth herein; rather, these embodiments are provided so that this disclosure will be thorough and complete, and will fully convey the concept of the inventive concept to those skilled in the art. In the drawings, the thicknesses of layers and regions are exaggerated for clarity. Like reference numerals in the drawings denote like elements, and thus their description will be omitted.

FIG. 1 is a diagram showing a structure of a memory cell array 10 of a vertical non-volatile memory device according to an embodiment of the inventive concept.

Referring to FIG. 1, the memory cell array 10 may include a plurality of NAND type cell string units 11 that may be arranged in a three-dimensional matrix structure. A memory cell block 13 may include a plurality of NAND type cell string units that are arranged in the x-axis direction or the y-axis direction.

Each of the NAND type cell string units 11 may include a plurality of memory cells MC1 through MCn, a string selecting transistor SST, and a ground selecting transistor GST. The ground selecting transistor GST, the plurality of memory cells MC1 through MCn, and the string selecting transistor SST may be sequentially arranged in the z-axis direction.

Bitlines BL1 through BLm may be connected to first ends of the NAND type cell string units 11 arranged in each of the memory cell blocks 13, e.g., drains of the string selecting transistors SST, and second ends of the cell string units 11, e.g., sources of the ground selecting transistors GST, may be connected to a common source line CSL.

The memory cells MC1 through MCn may be sequentially arranged in a vertical direction between the string selecting transistor SST and the ground selecting transistor GST. Wordlines WL1 through WLn may be connected to gates of memory cells that are arranged on a same layer. Data may be programmed to be read out from or erased from the memory cells MC1 through MCn by driving the wordlines WL1 through WLn.

The string selecting transistors SST may be arranged between the bitlines BL1 through BLm and the memory cells MC1 through MCn. The string selecting transistor SST arranged in each of the memory cell blocks 13 may control data transmission between the bitlines BL1 through BLm and the memory cells MC1 through MCn via string selecting lines SSL1 and SSL2. Although only one string selecting transistor SST is included in each of the NAND type cell string units 11 in FIG. 1, a pair of transistors may be arranged in series between a corresponding bitline of the bitlines BL1 through BLm and a corresponding memory cell of the memory cells MC1 through MCn, and each of the string selecting lines SSL1 and SSL2 may be connected to gates of a corresponding pair of transistors.

The ground selecting transistors GST may be arranged between the memory cells MC1 through MCn and the common source line CSL. The ground selecting transistors GST arranged in the memory cell block 13 may control data transmission between the memory cells MC1 through MCn and the common source line CSL via ground selecting lines GSL1 and GSL2. Although only one ground selecting transistor GST is included in each of the NAND type cell string units 11 in FIG. 1, a pair of transistors may be arranged in series between a corresponding memory cell of the memory cells MC1 through MCn and the common source line CSL, and each of the ground selecting lines GSL1 and GSL2 may be connected to gates of a corresponding pair of transistors.

FIGS. 2A through 2D are sectional views of the non-volatile memory device shown in FIG. 1 in the lengthwise direction of the bitlines BL1 through BLm. Referring to FIGS. 1 and 2A through 2D, the non-volatile memory device may include a semiconductor substrate 100, The semiconductor substrate 100 may be a IV group semiconductor substrate, a III-V group compound semiconductor substrate, or a II-VI group compound semiconductor substrate. For example, a IV group semiconductor substrate may be a silicon substrate, a germanium substrate, and a silicon-germanium substrate. The semiconductor substrate 100 may include a bulk wafer or an epitaxial layer.

First insulation pillars 140, which extend vertically with respect to a surface of the semiconductor substrate 100, may be arranged on first portions of the semiconductor substrate 100. The first insulation pillars 140 may contain undoped silica glass ("USG"), spin on glass ("SOG"), or tonen silazene ("TOSZ"). The cell string units 11 may be vertically arranged along side surfaces of the first insulation pillars 140. Channel layers 130 may be formed to surround bottom surfaces and side surfaces of the first insulation pillars 140 and to contact the first portions of the semiconductor substrate 100. Each of the channel layer 130 may be a semiconductor layer, e.g., an undoped poly-silicon layer.

The cell string units 11 may be arranged on the channel layers 130 that are arranged on the sidewalls of the first insulation pillars 140. The cell string units 11 are vertically arranged with respect to the surface of the semiconductor substrate 100, and may include the ground selecting transistor GST, the string selecting transistor SST, and the memory cells MC1 through MCn that are arranged between the ground selecting transistor GST and the string selecting transistor SST.

The ground selecting line GSL may be connected to gates 163 of the ground selecting transistors GST. The string selecting line SSL may be connected to gates 167 of the string selecting transistors SST. The wordlines WL1 through WLn may be connected to gates 165 of the memory cells MC1 through MCn. Each of the gates 163, 165, and 167 may include a metal layer. The metal layer may be a tungsten layer. Each of the gates 163, 165, and 167 may further include a barrier layer. The barrier layer may be a WN layer, a TaN layer, or a TiN layer.

Gate dielectric layers 161 may be further arranged on bottom surfaces and side surfaces of the gates 163, 165, and 167 to surround the gates 163, 165, and 167. The gate dielectric layers 161 may include charge tunnelling layers, charge storage layers, and charge blocking layers. The charge tunnelling layer may tunnel charges to the charge storage layers according to an FN method. The charge storage layer is a charge trapping type layer capable of storing charges. The charge blocking layers may contain high-k materials. The gate dielectric layers 161 may include oxide-nitride-alumina (ONA) or oxide-nitride-oxide-alumina (ONOA).

Insulation layers 110 may be arranged on the channel layers 130 between the gates 163, 165, and 167 that are arranged close to each other and on the gates 167 of the string selecting transistors SST in a vertical direction with respect to the surface of the semiconductor substrate 100. The insulation layers 110 may be oxide layers or nitride layers.

Impurity regions 150 may be arranged on second portions of the semiconductor substrate 100 between the cell string units 11 arranged on the sidewalls of the first insulation pillars 140. Each of the impurity regions 150 may include an N+ type high concentration impurity region 155 and N− type low concentration impurity regions 151 that are arranged on two opposite sides of the high concentration impurity region 155. The impurity regions 150 may functions as common source regions that are electrically connected to the common source line CSL of FIG. 1.

In the impurity regions 150, spacers 170 may be formed on the second portions of the semiconductor substrate 100 corresponding to the low concentration impurity regions 151. Conductive lines 180, which form an ohmic contact with the high concentration impurity regions 155, may be formed on the second portions of the substrates 100 between the spacers 170. The conductive lines 180 may function as the common source line CSL. Silicide layers 185 may be further arranged between the conductive lines 180 and the high concentration impurity regions 155 as shown in FIG. 2C. Each of the spacers 170 may include a silicon nitride layer. Each of the conductive lines 180 may include one of a W line, an Al line, and a Cu line. Each of the silicide layers 185 may be a metal silicide layer, e.g., a cobalt silicide layer.

Figure 2A:
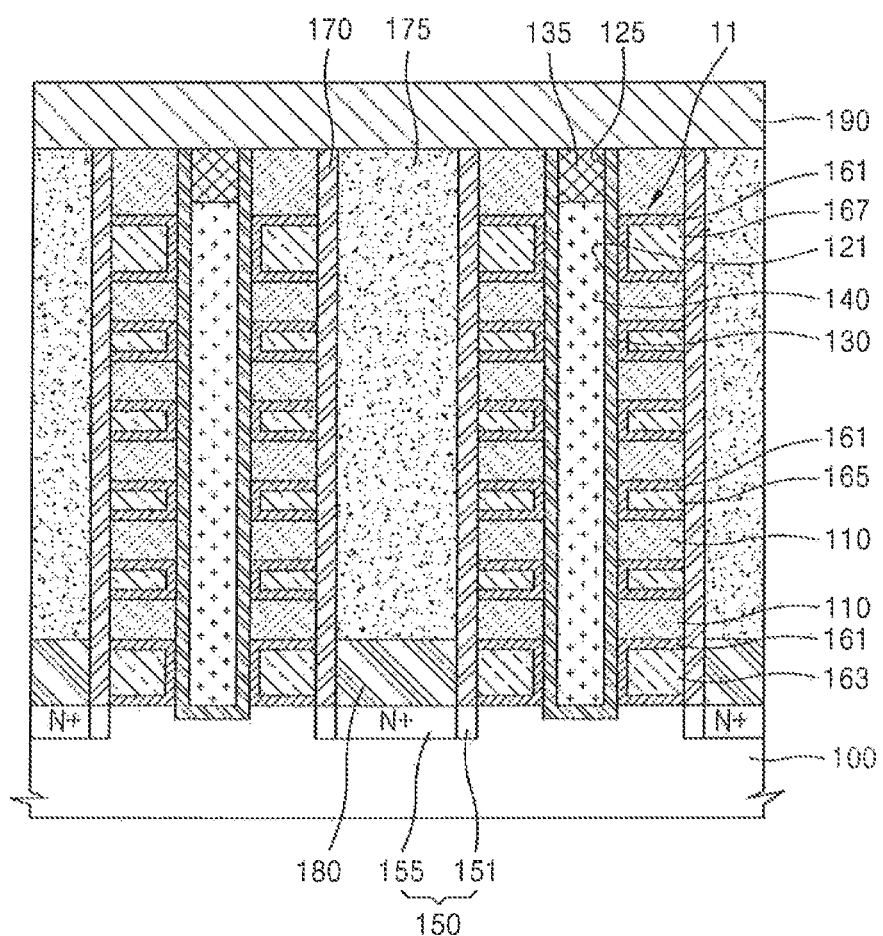
FIGS. 2A through 2D are sectional views of the non-volatile memory device shown in FIG. 1.
Figure 2B:
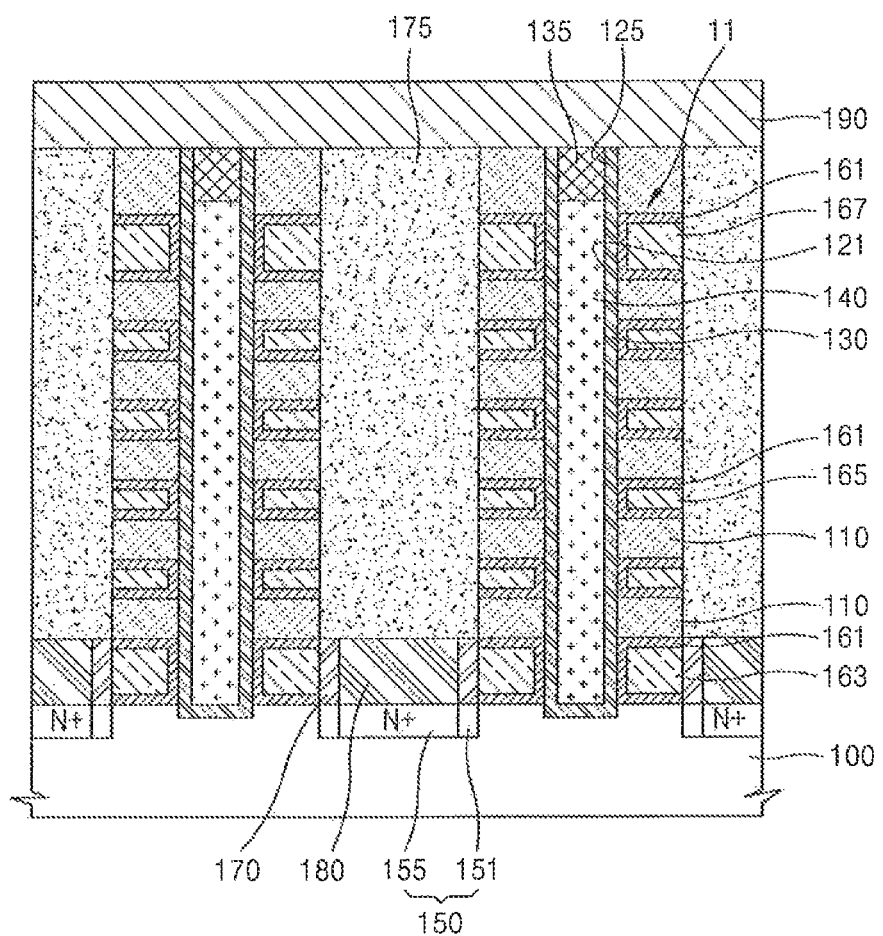
Figure 2C:
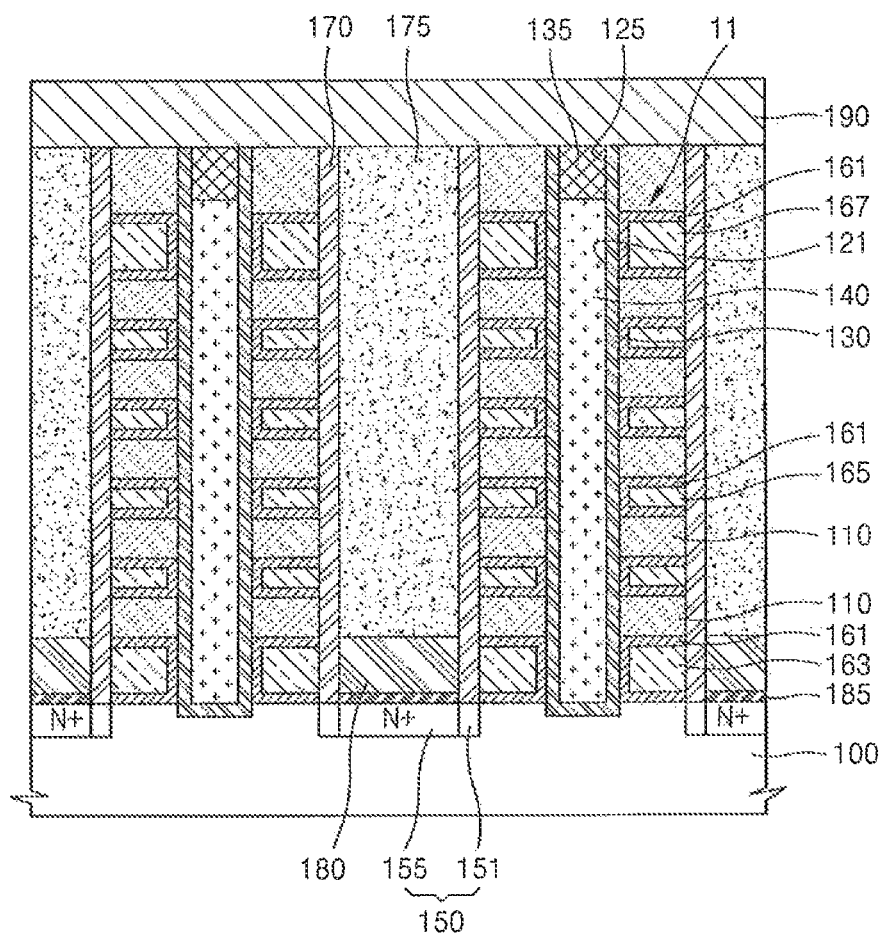

The conductive lines 180 may be arranged only in portions of second openings 123 (refer to FIG. 6) as shown in FIG. 2A. The conductive lines 180 may be formed such that top surfaces of the conductive lines 180 are located lower than bottom surfaces of the gates which are applied with relatively higher voltages and are arranged closest to the semiconductor substrate 100 among the gates 165 of the memory cells MC1 through MCn. The spacers 170 may be arranged to completely cover exposed side surfaces of the insulation layers 110, the gates 163, 165, and 167, and the gate dielectric layers 161 as shown in FIG. 2A, or may be arranged only on two opposite side surfaces of the conductive lines 180 as shown in FIG. 2B.

Figure 2D:
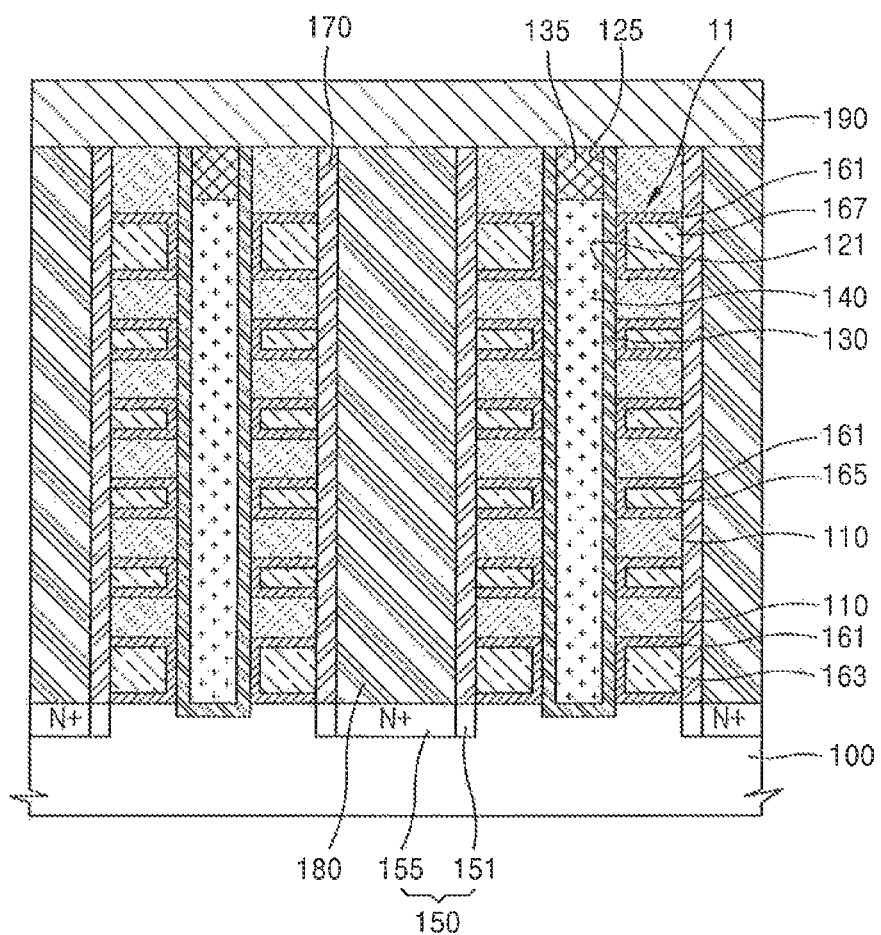

The conductive lines 180 may be formed as pillars so that the openings 123 (refer to FIG. 6) are completely filled as shown in FIG. 2D. Although it is shown in FIG. 2D that bitlines 190 are directly arranged on the conductive lines 180, interlayer insulation layers (not shown), e.g., oxide-layer type interlayer insulation layers, may be arranged on the topmost insulation layers 110 and the conductive lines 180. Therefore, metal contacts (not shown) may be arranged on the interlayer insulation layers, so that the bitlines 190 may be electrically connected to the channel layers 130 and conductive layers 135 and may be electrically insulated from the conductive lines 180.

Second insulation pillars 175, which extend vertically with respect to the surface of the semiconductor substrate 100, may be arranged on the conductive lines 180 between the spacers 170. The second insulation pillars 175 may include an oxide-layer type interlayer insulation layer (not shown), e.g., a boron phosphorus silicate glass ("BPSG") layer. The second insulation pillars 175 may be arranged on the spacers 170 and the conductive lines 180 as shown in FIG. 2B.

The conductive layers 135 may be further arranged on top of the first insulation pillars 140. Trenches 125 may be formed in the first insulation pillars 140, and the conductive layers 135 may be buried in the trenches 125. Each of the conductive layers 135 may be a doped poly-silicon layer. The bitlines 190 may be formed to contact the channel layers 130 and the conductive layers 135.

Although channel layers are formed on sidewalls of pillars in a non-volatile memory device according to an embodiment, the inventive concept is not limited thereto. For example, channel layers may be formed to have a linear shape without pillars or be formed to have a macaroni shape cylindrically surrounding pillars.

FIGS. 3 through 13 are sectional views illustrating a method of fabricating the non-volatile memory device shown in FIGS. 1 and 2A through 2D.

Figure 3:
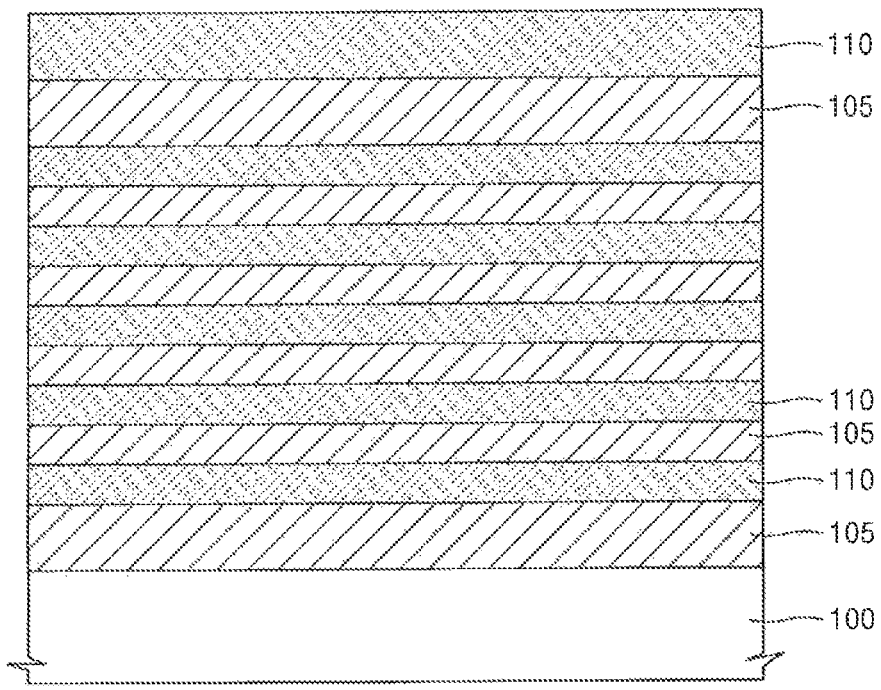
FIGS. 3 through 13 are sectional views illustrating a method of fabricating the non-volatile memory device shown in FIG. 2A.

Referring to FIG. 3, sacrificing layers 105 and insulation layers 110 may be alternately stacked on the semiconductor substrate 100. The sacrificing layer 105 may be formed on the semiconductor substrate 100 as the bottommost layer. The insulation layer 110 may be stacked as the topmost layer. The sacrificing layers 105 may be stacked corresponding to the number of the string selecting transistor SST, ground selecting transistor GST, and the memory cells MC1 through MCn which constitute the cell string unit 11. The sacrificing layers 105 may contain a material having an etching selectivity with respect to the insulation layers 110. The insulation layers 110 may be silicon oxide layers, and the sacrificing layers 105 may be silicon nitride layers. The insulation layers 110 may be silicon nitride layers, and the sacrificing layers 110 may be silicon oxide layers.

Figure 4:
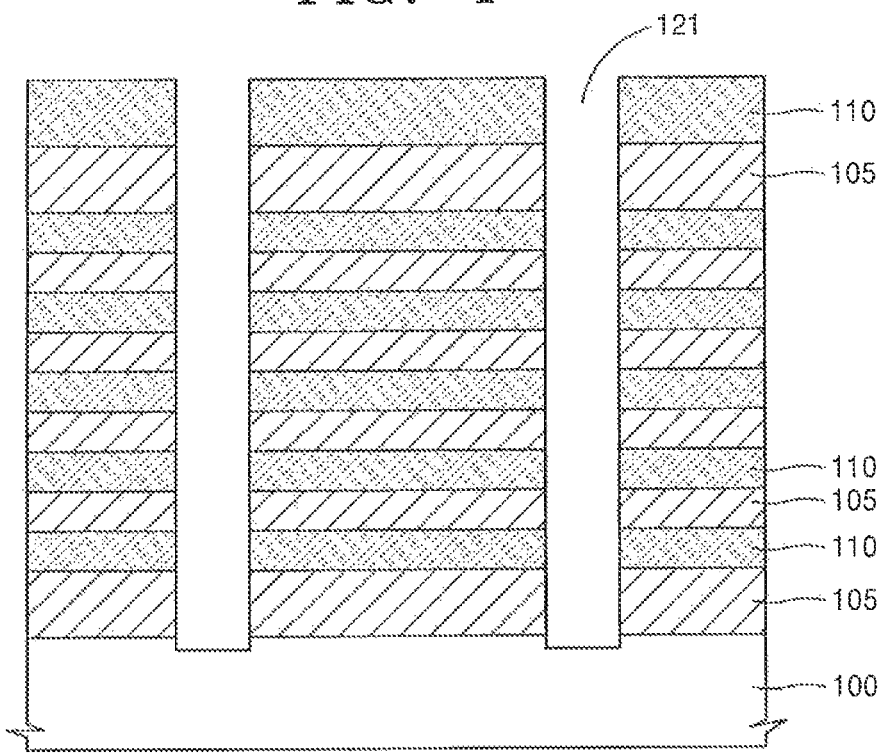

Referring to FIG. 4, a mask pattern (not shown) for defining channel regions may be formed over the semiconductor substrate 100. First openings 121, which define the channel regions in the sacrificing layers 105 and the insulation layers 110, may be formed by etching the sacrificing layers 105 and the insulation layers 110 by using the mask pattern as an etching mask. The first openings 121 may expose the first portions of the semiconductor substrate 100. The mask pattern may be removed. The first portions of the semiconductor substrate 100 exposed through the first openings 121 may be further etched to a predetermined depth.

Figure 5:
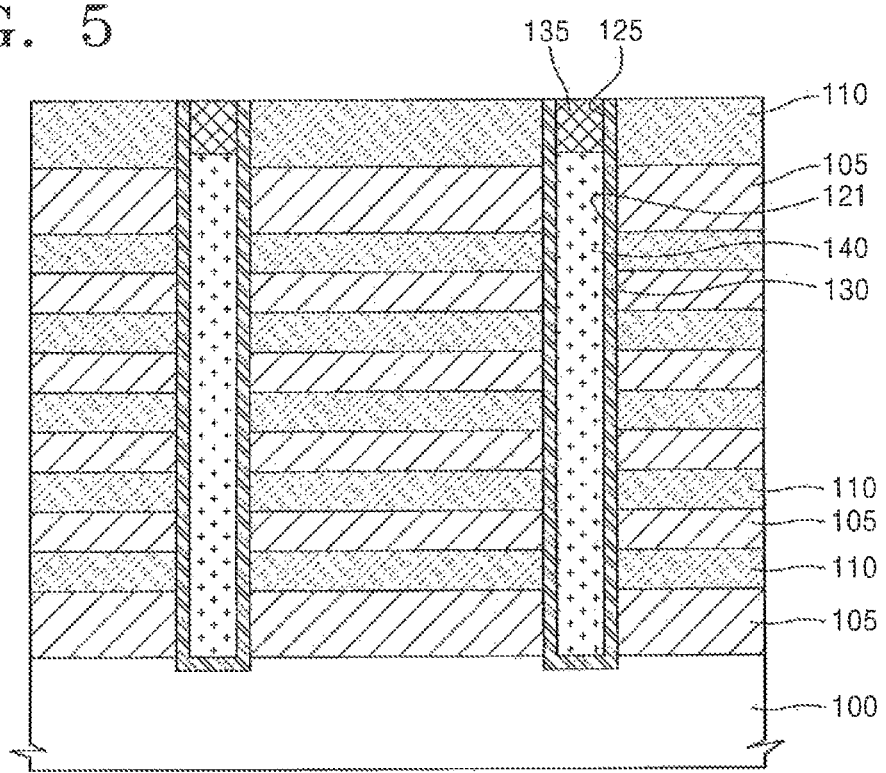

Referring to FIG. 5, the channel layers 130 may be formed on bottom surfaces and side surfaces of the first openings 121. The channel layers 130 may be formed to contact the first portions of the semiconductor substrate 100 via the first openings 121. Each of the channel layers 130 may be a semiconductor layer. The channel layers 130 may be formed on the bottom surfaces and the side surfaces of the first openings 121 by depositing undoped poly-silicon layers on the first openings 121 and the topmost insulation layer 110 and patterning the deposited poly-silicon layers.

An interlayer insulation layer may be deposited onto the semiconductor substrate 100 such that the first openings 121 are completely filled, and the first insulation pillars 140 may be formed on the channel layers 130 by etching the interlayer insulation layer using chemical mechanical polishing ("CMP") or etchback. The first insulation pillars 140 may include oxide layers, such as USG, TOSZ, and SOG.

Next, the trenches 125 are formed by etching the first insulation pillars 140 to a predetermined depth, and the conductive layers 135 are formed in the trenches 125. The conductive layers 135 may be formed by depositing an N+ type poly-silicon layer onto the trenches 125 such that the trenches 125 are filled and etching the poly-silicon layer using etchback or CMP to form N+ icon patterns in the trenches 125.

Figure 6:
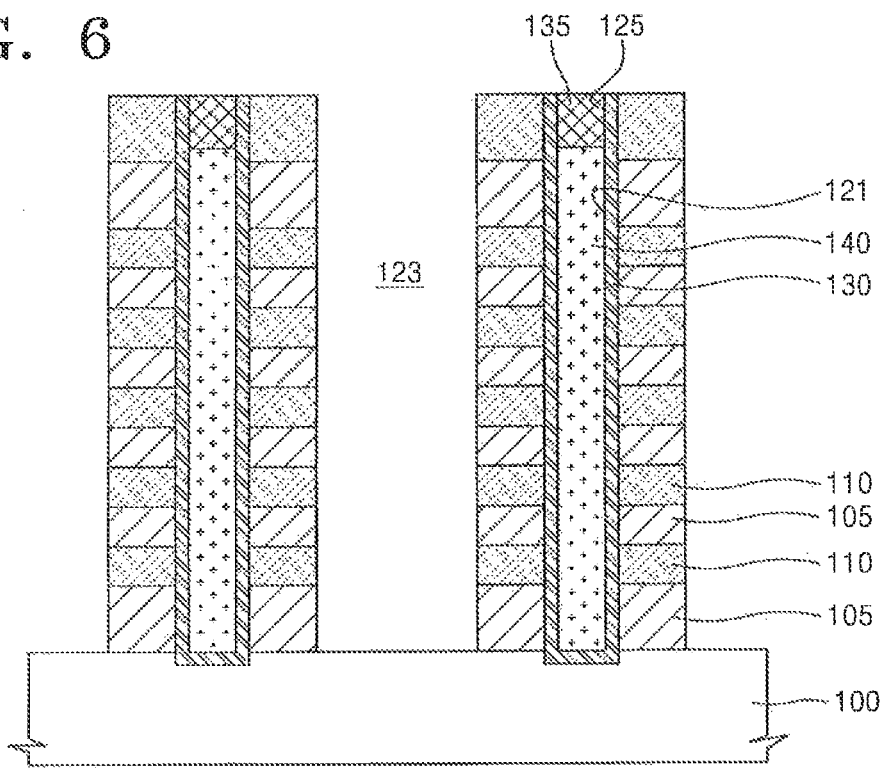

Referring to FIG. 6, a photosensitive layer (not shown) may be formed on the topmost insulation layer 110, the channel layers 130, and the conductive layers 135. The photosensitive layer may expose portions of the topmost insulation layer 110 corresponding to the second portions of the semiconductor substrate 100. The second portions of the semiconductor substrates 100 may include portions on which common source regions are to be formed between the first insulation pillars 140. The second openings 123, which expose the second portions of the semiconductor substrate 100, may be formed by etching the insulation layers 110 and the sacrificing layers 105 by using the photosensitive layer as an etching mask. Side surfaces of the sacrificing layers 105 and the insulation layers 110 may be exposed by forming the second openings 123.

Figure 7:
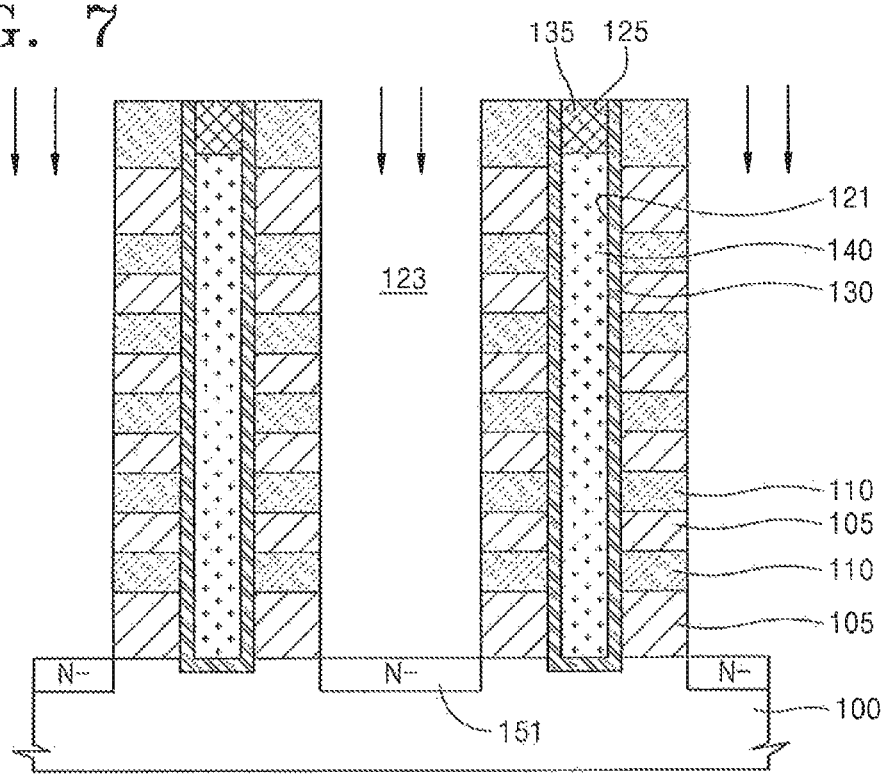

Referring to FIG. 7, the low concentration impurity regions 151 may be formed on the second portions of the semiconductor substrate 100 between the first insulation pillars 140 by ion-implanting N− type impurities into the second portions of the semiconductor substrate 100 exposed through the second openings 123.

Figure 8:
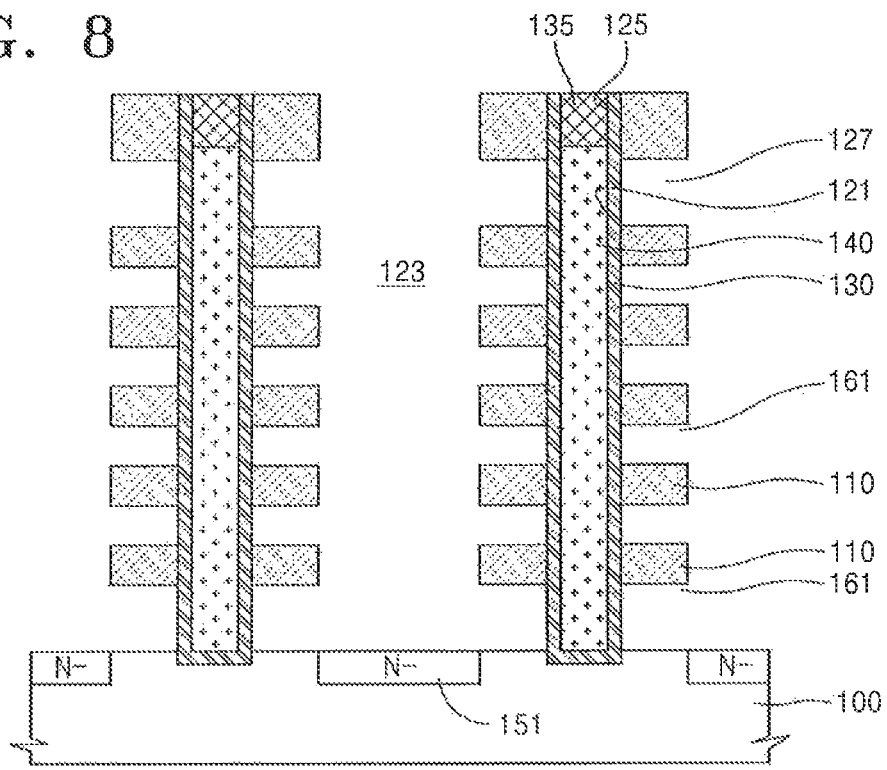

Referring to FIG. 8, the sacrificing layers 105 exposed through the second openings 123 may be removed. The sacrificing layers 105 may be removed by using wet-etching. Upon removing the sacrificing layers 105, side openings 127, which extend at two opposite sides of the second openings 123, may be formed. The side openings 127 may expose portions of the channel layers 130 and third portions of the semiconductor substrate 100 in two opposite sides of the low concentration impurity regions 151. The side openings 127 may define gate forming areas to be formed in a later operation.

Figure 9:
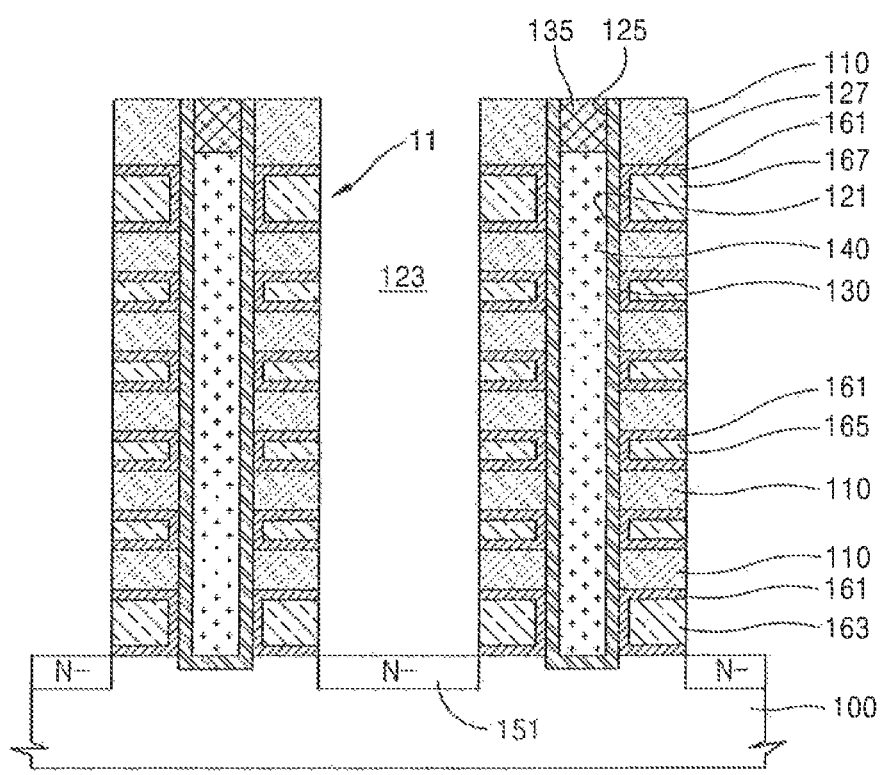

Referring to FIG. 9, a dielectric layer (not shown) may be formed on the channel layers 130, the insulation layers 110, and the second and third portions of the semiconductor substrate 100, which are exposed through the side openings 127 and the second openings 123, A conductive layer (not shown) may be formed on the dielectric layer such that the side openings 127 and the second openings 123 are completely filled.

The gate dielectric layers 161 and the gates 163, 165, and 167 that are arranged in the side openings 127 may be formed by etching the dielectric layer and the conductive layer. The gate dielectric layers 161 may be arranged on bottom surfaces and side surfaces of the side openings 127, and the gates 163, 165, and 167 may be formed on the gate dielectric layers 161 such that the gates 163, 165, and 167 are completely buried in the side openings 127.

The bottommost gates 163 may include gates of the ground selecting transistors GST of the cell string units 11 of FIG. 1, and the topmost gates 167 may include gates of the string selecting transistors SST. The gates 165 arranged between the gates 163 and 167 may include control gates of the memory cells MC1 through MCn. Each of the gate dielectric layers 161 may include a tunnelling layer, a charge storage layer, and a charge blocking layer. Each of the gate insulation layers 161 may include ONA or ONOA. The gates 163, 165, and 167 may include metal layers, such as tungsten layers, and barrier layers.

Figure 10:
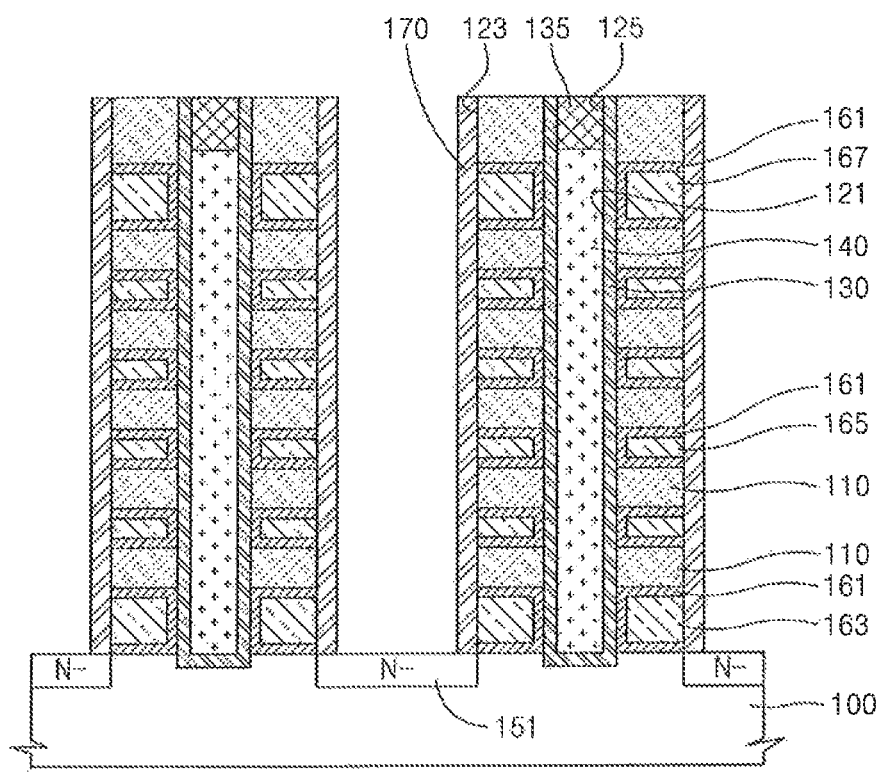

Referring to FIG. 10, the spacers 170 arranged on the side surfaces of the second openings 123 may be formed on the second portions of the semiconductor substrate 100. The spacers 170 may be arranged to cover side surfaces of the insulation layers 110, the gate dielectric layers 161, and the gates 163, 165, and 167 that are exposed through the second openings 123. The spacers 170 may be formed by depositing an insulation layer (not shown) on the topmost insulation layer 110 and on side surfaces of the second openings 123 and etching the insulation layer using etchback or CMP to form the spacers 170. The insulation layer for the spacers 170 may be a silicon nitride layer.

Figure 11:
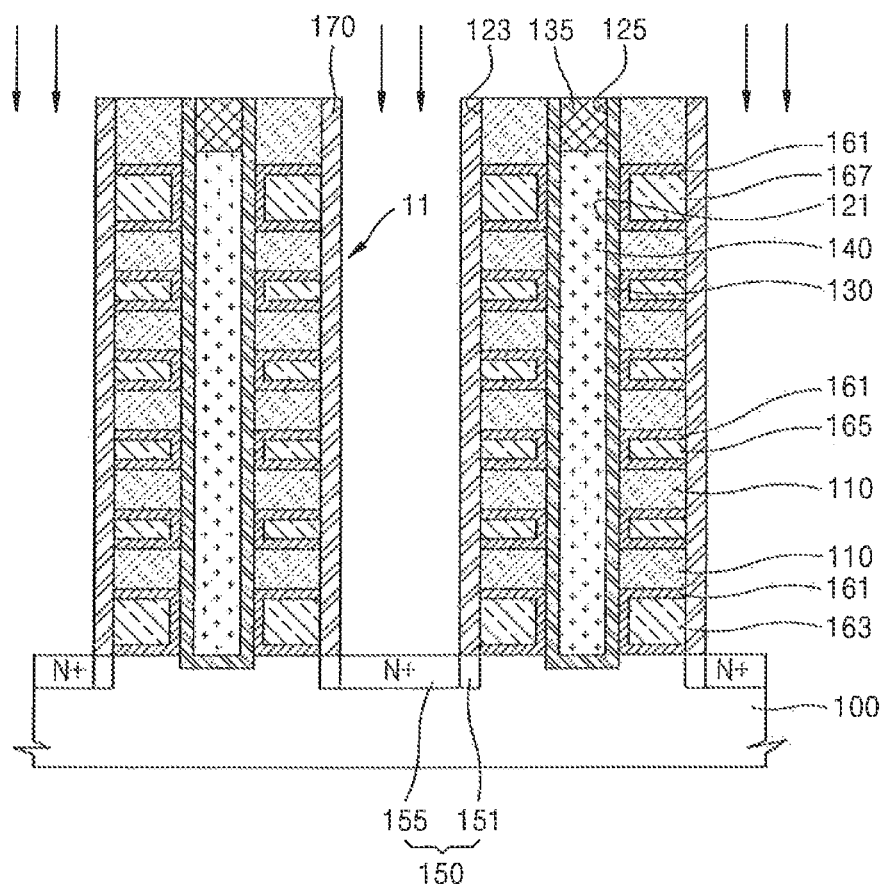

Referring to FIG. 11, the high concentration impurity regions 155 may be formed by ion-implanting N+ type impurities into the second portions of the semiconductor substrate 100 exposed through the second openings 123. The high concentration impurity regions 155 may be arranged on the second portions of the semiconductor substrate 100 between the cell string units 11. The high concentration impurity regions 155 may be formed such that the low concentration impurity regions 151 are left at both sides of the high concentration impurity regions 155. The high concentration impurity regions 155 and the low concentration impurity regions 151 may function as common source regions.

Figure 12:
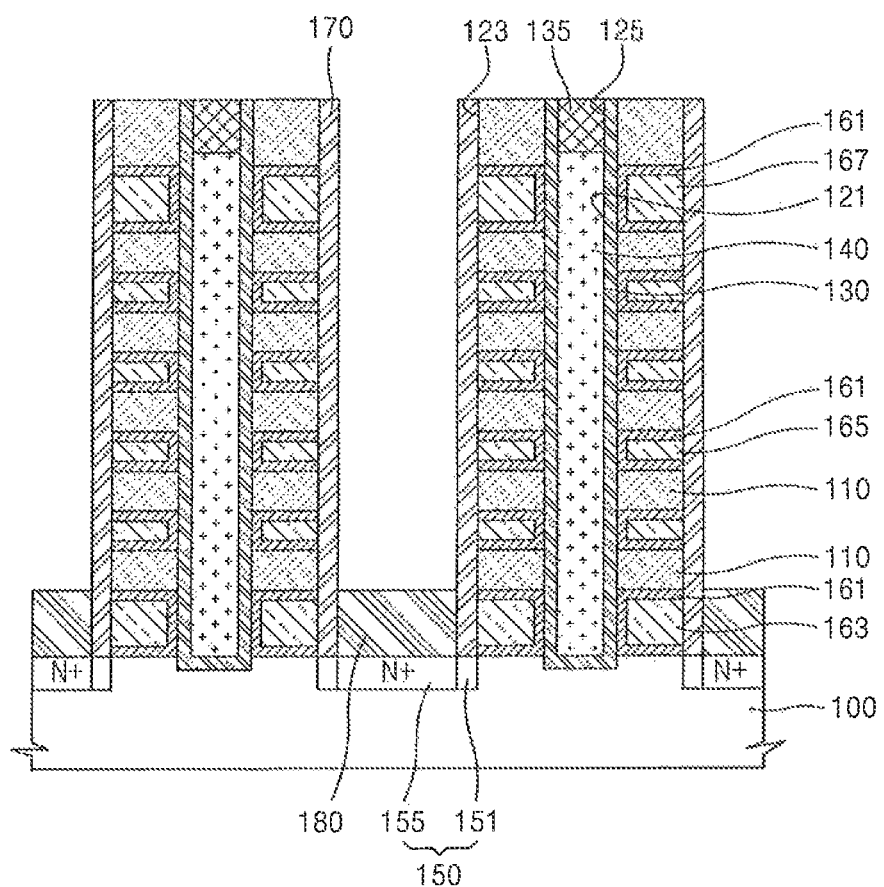

Referring to FIG. 12, the conductive lines 180 may be formed on the high concentration impurity regions 155 in the second openings 123. The conductive lines 180 may include a metal line, such as a W line, an Al line, and a Cu line. The conductive lines 180 may form an ohmic contact with the high concentration impurity regions 155 to decrease contact resistance of the conductive lines 180. The conductive lines 180 may function as common source lines. Top surfaces of the conductive layers 180 may be located lower than bottom surfaces of the gates 165 of the lowest memory cells MC1.

Figure 29:
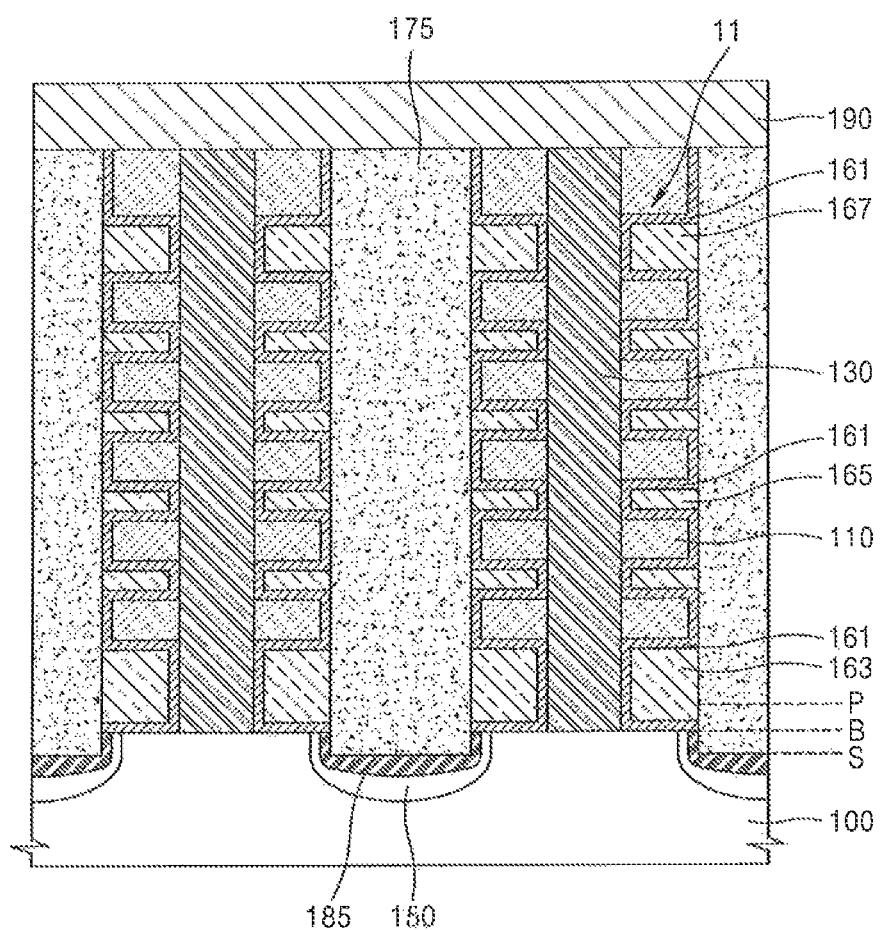

Before forming the conductive lines 180, the silicide layers 185, which contact the high concentration impurity regions 155, may be further formed as shown in FIG. 2C. The conductive lines 180 may be formed by depositing a metal layer (not shown) onto the entire semiconductor substrate 100 including the second openings 123 and etching the metal layer, so that the conductive lines 180 are partially buried in the second openings 123 as shown in FIGS. 2A and 29. When the metal layer is etched, the spacers 170 may also be etched as shown in FIG. 2B. Alternatively, the conductive lines 180 may also be formed by selectively depositing a metal layer only on the silicide layers 185. The conductive lines 180 may also be formed to be completely buried in the second openings 123 and to be shaped as pillars, as shown in FIG. 2D.

Figure 13:
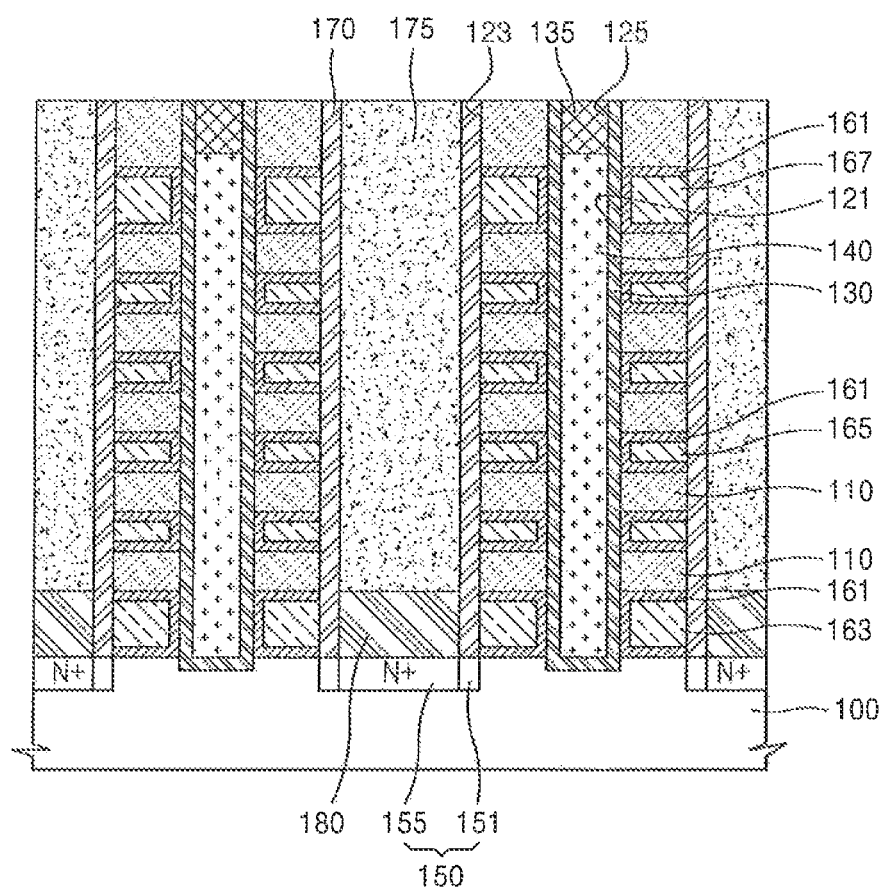

Referring to FIG. 13, the second insulation pillars 175 are formed on the conductive lines 180 to completely fill the second openings 123. The second insulation pillars 175 may be formed by depositing an oxide layer (not shown), such as BPSG, onto the spacers 170 to fill the second openings 123 and etching the oxide layer using etchback method or CMP method to form oxide layers in the second openings 123.

After forming at least one oxide-type interlayer insulation layer (not shown) on the entire substrate and forming metal contacts (not shown), which expose portions of the channel layers 130 and/or portions of the conductive layers 135, bitlines 190 (FIGS. 2A through 2D) may be formed. The bitlines 190 contact the portions of the channel layers 130 and/or the portions of the conductive layers 135 via the metal contacts.

FIGS. 14A through 14D are sectional views showing other embodiments of the non-volatile memory device of FIG. 1. FIGS. 14A through 14D are schematic sectional views in the lengthwise direction of the bitlines BL1 through BLm of FIG. 1.

Figure 14A:
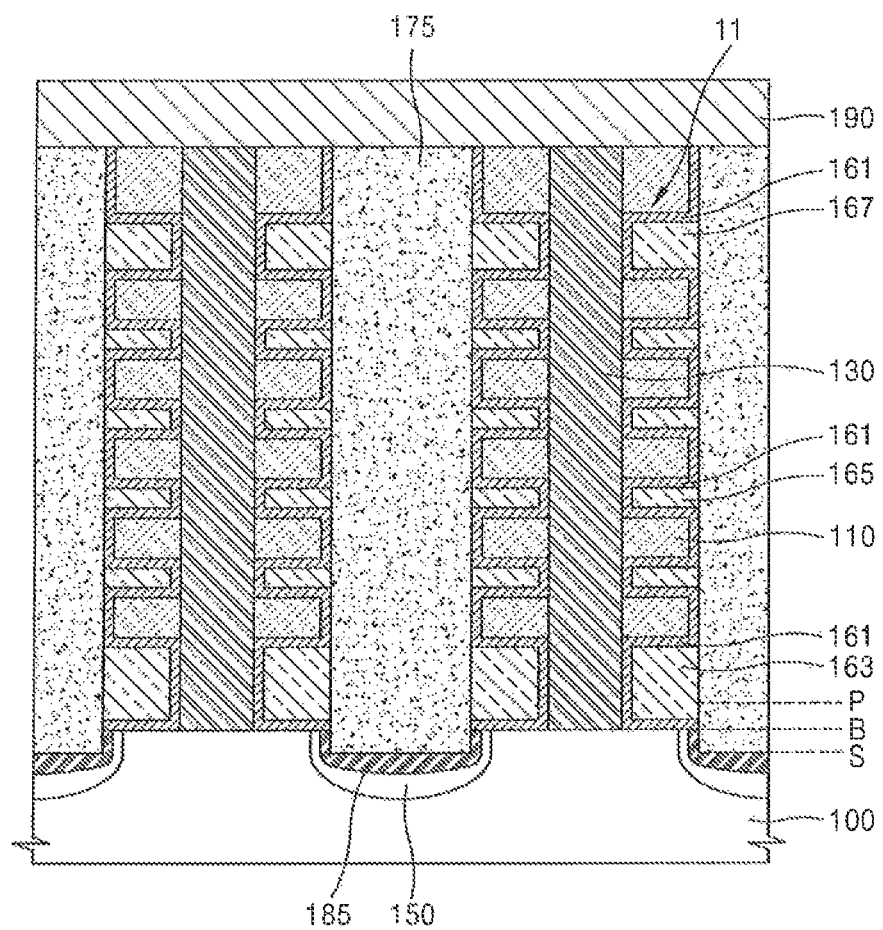
FIGS. 14a through 14d are sectional views showing modified embodiments of the non-volatile memory device shown in FIG. 1.

Referring to FIGS. 1 and 14A, the substrate 100 may be a IV group semiconductor substrate, a group compound semiconductor substrate, or a II-VI group compound semiconductor substrate, as described above. Here, a IV group semiconductor substrate may be a silicon substrate, a germanium substrate, and a silicon-germanium substrate. The semiconductor substrate 100 may include a bulk wafer or an epitaxial layer.

The channel layers 130, which are formed vertically with respect to a surface of the substrate 100, may be arranged on first portions of the substrate 100. The cell string units 11 may be vertically arranged along side surfaces of the channel layers 130. Each of the channel layers 130 may include a semiconductor layer, e.g., an undoped poly-silicon layer.

The cell string units 11 are vertically arranged with respect to the surface of the substrate 100, and each of the cell string units 11 may include the ground selecting transistor GST, the string selecting transistor SST, and the plurality of memory cells MC1 through MCn, which are arranged between the selecting transistors GST and SST.

The ground selecting lines GSL, may be connected to the gates 163 of the ground selecting transistors GST. The gates 163 of the ground selecting transistors GST are formed lower than the gates of the ground selecting transistors according to the embodiment described in connection with FIGS. 2A through 2D. Specifically, in the embodiment described in connection with FIGS. 2A through 2D, the gates of the ground selecting transistors GST are formed without further etching of the substrate, and thus bottom dielectric layers of the gates of the ground selecting transistors GST are formed on the top surface of the initial substrate, that is, the top surface P of the substrate in the peripheral region. However, in the present embodiment, the substrate is further etched, and thus bottom dielectric layers 161 of the gates 163 of the ground selecting transistors GST are formed on a further etched portion B of the substrate. Since the bottom dielectric layers 161 are formed on the portion B at which the channel layers 130 and the substrate contact each other, the distance between the channel layers 130 and the impurity regions 150, e.g. source regions, are reduced, and thus channel disconnection below a selecting transistor may be prevented.

As described above, the string selecting lines SSL may be connected to the gates 167 of the string selecting transistors SST. The wordlines WL1 through WLn may be connected to the gates 165 of the memory cell transistors MC1 through MCn. Each of the gates 163, 165, and 167 may include a metal layer. The metal layer may be a tungsten layer. Each of the gates 163, 165, and 167 may further include a barrier layer. The barrier layer may be a WN layer, a TaN layer, or a TiN layer.

Gate dielectric layers 161 may be further arranged on bottom surfaces and side surfaces of the gates 163, 165, and 167 to surround the gates 163, 165, and 167. Although the gate dielectric layers 161 have been formed on the sidewalls of the second openings 123 (refer to FIG. 19) in the drawings, the gate dielectric layers 161 may also be omitted from the sidewalls of the second openings 123.

The gate dielectric layers 161 may include charge tunnelling layers, charge storage layers, and charge blocking layers. The charge tunnelling layer may tunnel charges to the charge storage layers according to an F-N method. The charge storage layer may be a charge trapping type layer capable of storing charges. The charge blocking layers may contain high-k materials. The gate dielectic layers 161 may include oxide-nitride-alumina ("ONA") or oxide-nitride-oxide-alumina ("ONOA").

The insulation layers 110 may be arranged on the channel layers 130 between the gates 163, 165, and 167 that are arranged close to each other and on the gates 167 of the string selecting transistors SST in a vertical direction with respect to the surface of the semiconductor substrate 100. The insulation layers 100 may be oxide layers or nitride layers.

The impurity regions 150 may be arranged on second portions of the semiconductor substrate 100 between the cell string units 11 arranged on the sidewalk of the channel layers 130. Each of the impurity regions 150 may include an N+ type high concentration impurity region and N− type low concentration impurity regions that are arranged outside the high concentration impurity region. The impurity regions 150 may functions as common source regions that are electrically connected to the common source line CSL of FIG. 1.

In the present embodiment, a metal silicide layer 185, e.g. a cobalt silicide (CoSi$_x$) layer, may be formed on the impurity regions 150, wherein the metal silicide layer 185 constitutes a common source line CSL. In the present embodiment, the metal silicide layer 185, which functions as the common source line CSL, may be formed at a position S lower than the position B of the bottom dielectric layers 161 of the gates 163 of the ground selecting transistors GST, because the substrate is further etched, as compared to the embodiment shown in FIG. 2C. A pillar-structured insulation layer 175 may be formed on the metal silicide layer 185, where the insulation layer 175 may include an oxide-layer type interlayer insulation layer, e.g., a BPSG layer.

Figure 14B:
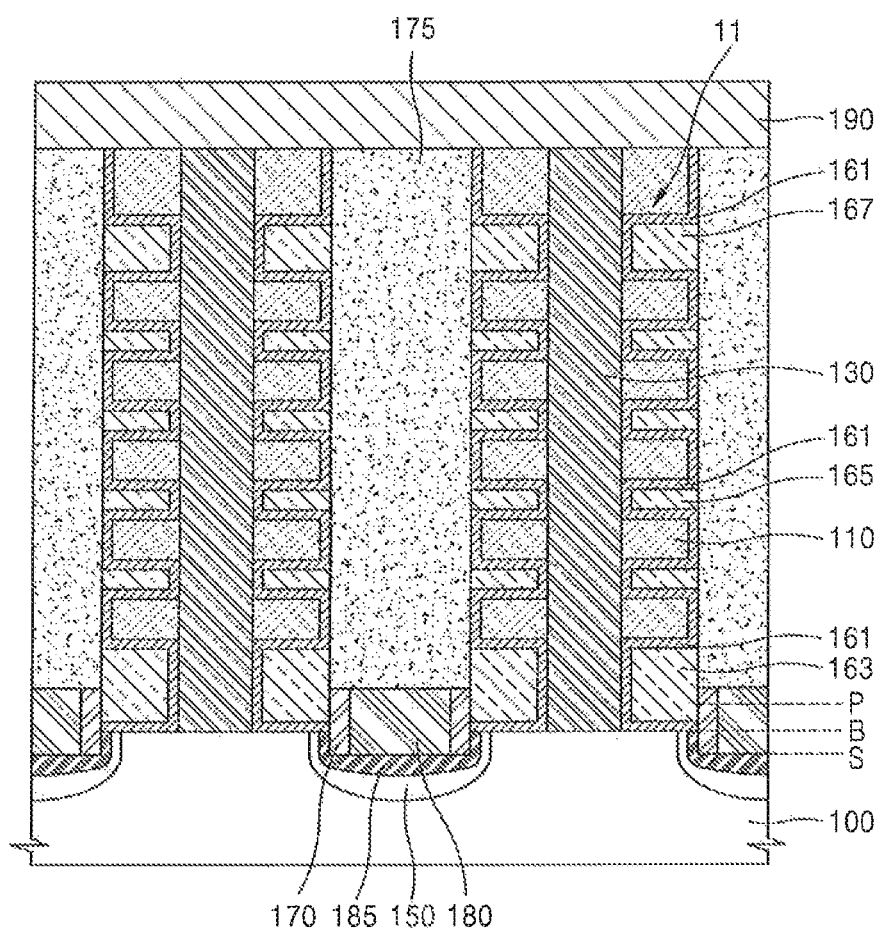

Referring to FIGS. 1 and 14B, unlike the embodiment shown in FIG. 14A, the conductive lines 180 are formed on the metal silicide layer 185, and the spacers 170 may be formed on the two opposite sidewalk of each of the conductive lines 180 for insulation from the gates 163 of the ground selecting transistors GST. The conductive lines 180 and the metal silicide layer 185 may function together as the common source line CSL. Here, the conductive lines 180 may be formed such that top surfaces of the conductive lines 180 are located lower than bottom surfaces of gates arranged closest to the semiconductor substrate 100 among the gates 165 of the memory cells MC1 through MCn to which relatively higher voltages are applied.

Each of the spacers 170 may include a silicon nitride layer. Each of the conductive lines 180 may include a metal line, such as a W line, an Al line, or a Cu line. The pillar-structured insulation layer 175 may be formed on the spacers 170 and the conductive lines 180.

Figure 14C:
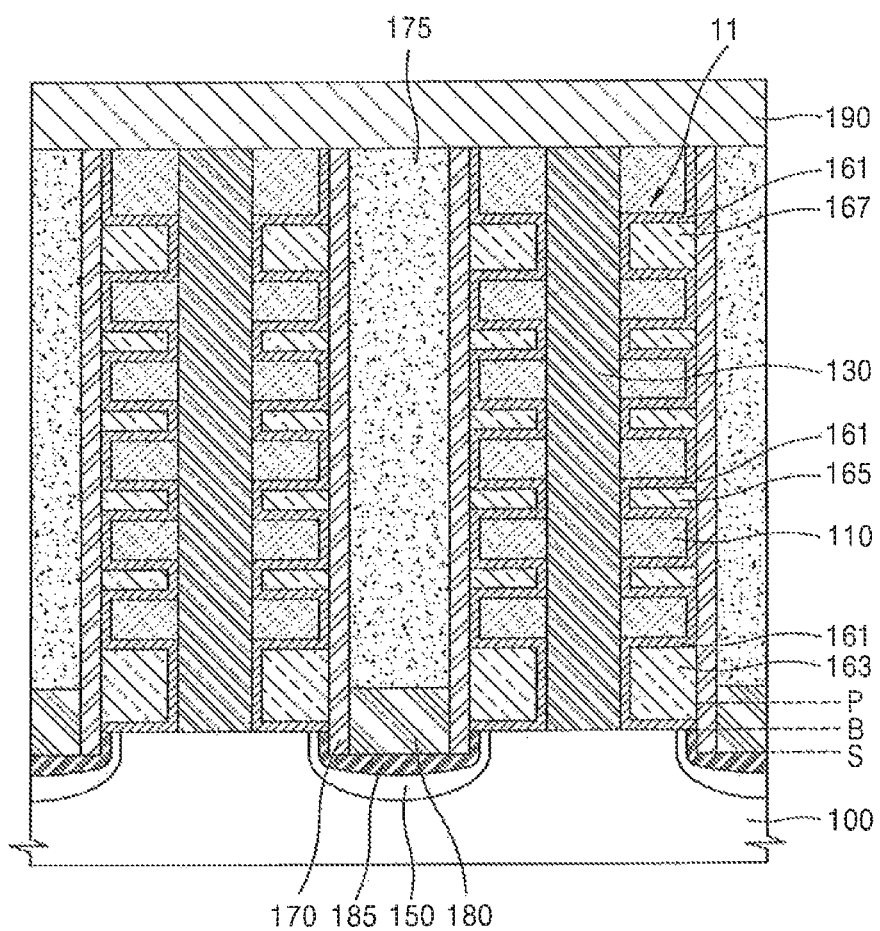

Referring to FIGS. 1 and 14C, in the embodiment shown in FIG. 14C, the spacers 170 are formed on the entire sidewalls of the second openings 123, and the conductive lines 180 may be formed between the lower parts of the spacers 170. The conductive lines 180 may be formed in the entire space between the spacers 170 as shown in FIG. 2D, However, since the conductive lines 180 are not be directly connected to the bitlines 190, insulation layers, e.g., oxide-layer type interlayer insulation layers, may be arranged between the bitlines 190 and the conductive lines 180.

Figure 14D:
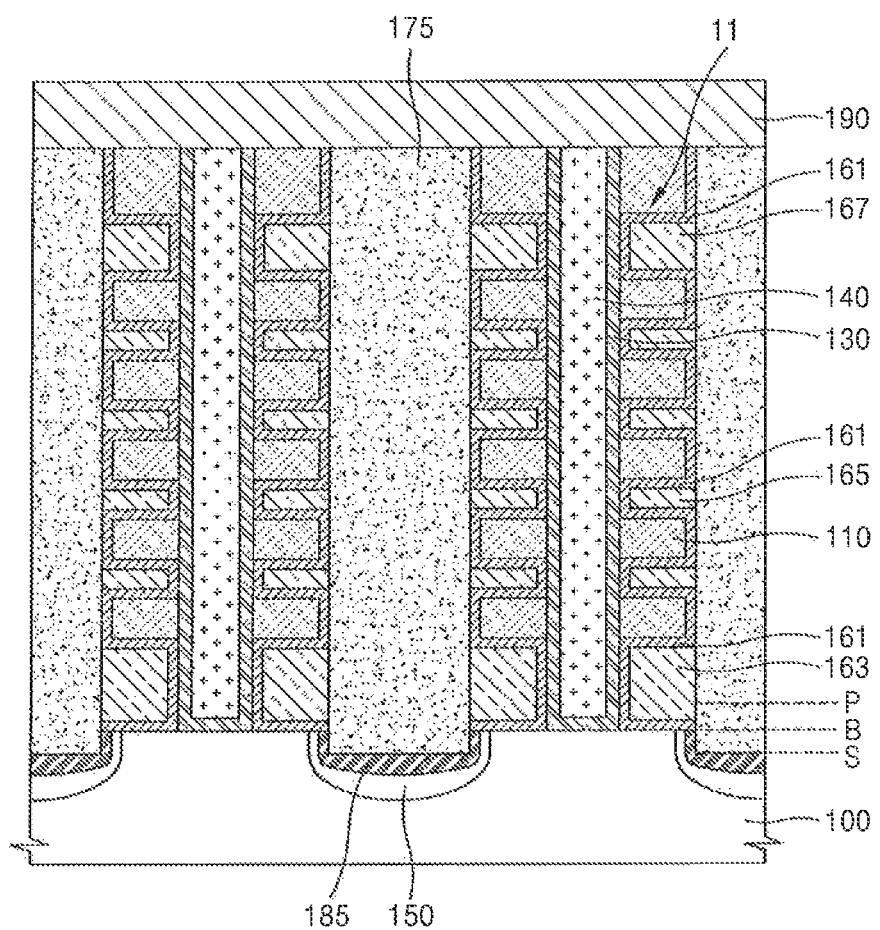

Referring to FIGS. 1 and 14D, the channel layers 130 may be formed to surround the sidewalls and the bottom surfaces of the first insulation pillars 140 in the embodiment shown in FIG. 14D, similarly to the embodiment described in connection with FIGS. 2A through 2D. Furthermore, although the insulation layer 175 is formed directly on the metal silicide layer 185, the conductive lines 180 or the spacers 170 may be also interposed between the insulation layer 175 and the metal silicide layer 185 as shown in FIG. 14B or FIG. 14C.

Conductive layers (not shown) may be further arranged on top of the first insulation pillars 140, as shown in FIGS. 2A through 2D. In the case where the conductive layers are arranged, trenches may be formed on a portion of the first insulation pillars 140, and the conductive layers may be buried in the trenches. Each of the conductive layers may be a doped poly-silicon layer, and the bitlines 190 may be formed to contact the channel layers 130 and the conductive layers 135.

Although channel layers are formed to have a linear shape in a non-volatile memory device according to the present embodiment, the inventive concept is not limited thereto. For example, channel layers may be formed to have a macaroni shape cylindrically surrounding pillars.

Figure 15:
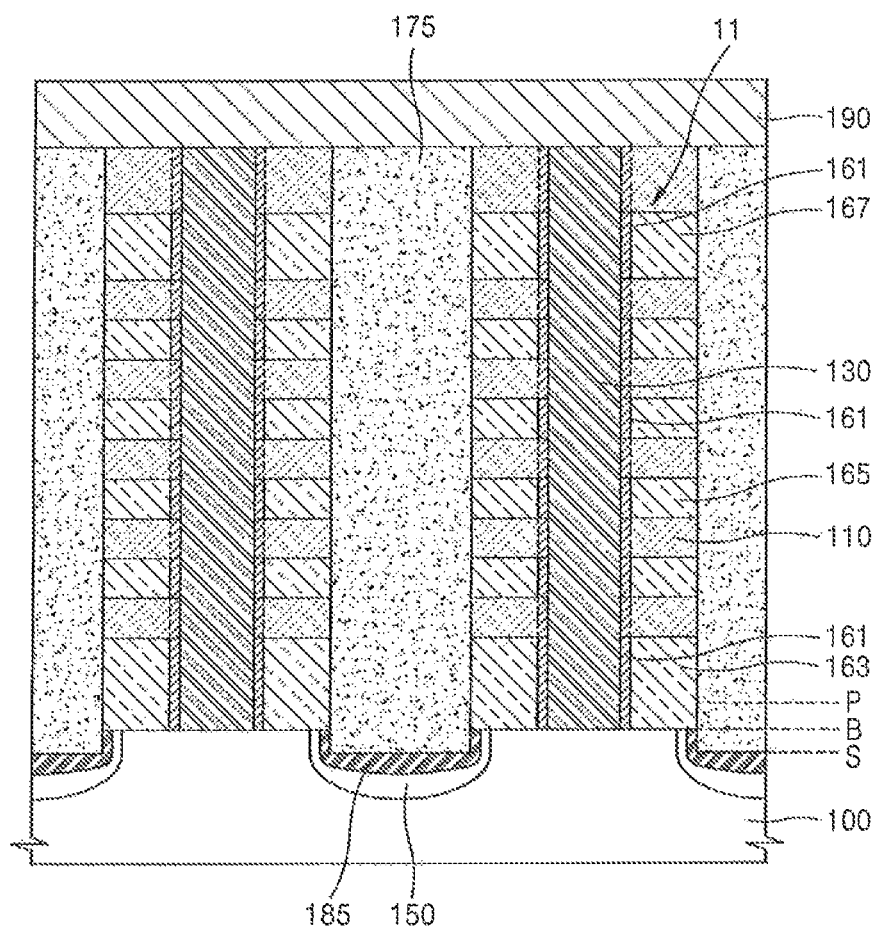
FIG. 15 is a sectional view showing a modified embodiment of the non-volatile memory device shown in FIG. 1.

FIG. 15 is a sectional view showing another embodiment of the non-volatile memory device of FIG. 1. FIG. 15 is a schematic sectional view in the lengthwise direction of the bitlines BL1 through BLm of FIG. 1.

Referring to FIG. 15, unlike the embodiment shown in FIGS. 14A through 14D, the gate dielectric layers 161 may be formed only on the sidewalls of the channel layers 130 to be vertical to the surface of the substrate in the present embodiment. The gate dielectric layers 161 may be formed such that the lower portions of the gate dielectric layers 161 extend up to position B at which the channel layers 130 contact the substrate. In other words, the lower portions of the gate dielectric layers 161 may extend up to a position lower than position P of the top surface of the substrate in the peripheral region.

As described above with reference to FIG. 14A, the gate dielectric layers 161 may include charge tunnelling layers, charge storage layers, and charge blocking layers. The charge tunnelling layer may tunnel charges to the charge storage layers according to an F-N method. The charge storage layer may be a charge trapping type layer capable of storing charges. The charge blocking layers may contain high-k materials. The gate dielectic layers 161 may include oxide-nitride-alumina (ONA) or oxide-nitride-oxide-alumina (ONOA).

In the present embodiment, the gate dielectic layers 161 may be formed by forming first openings for forming the channel layers 130 and depositing insulation layer, which are formed of the above-stated material, on two opposite sidewalls of each of the first openings. Furthermore, the gate dielectic layers 161 may function as protective layers for protecting the channel layers 130 when sacrifice layers are removed via second openings by using wet-etching.

Although the insulation layer 175 is formed directly on the metal silicide layer 185 in the present embodiment, the conductive lines 180 or the spacers 170 may be interposed between the insulation layer 175 and the metal silicide layer 185 as shown in FIG. 14B or FIG. 14C. Furthermore, although channel layers are formed to have a linear shape in a non-volatile memory device according to the present embodiment, the inventive concept is not limited thereto. For example, channel layers may be formed on sidewalls of pillars as shown in FIG. 14D, or channel layers may be formed to have a macaroni shape cylindrically surrounding pillars.

FIGS. 16 through 29 are sectional views for describing a method of fabricating the non-volatile memory device shown in FIGS. 1 and 14A through 14D.

Figure 16:
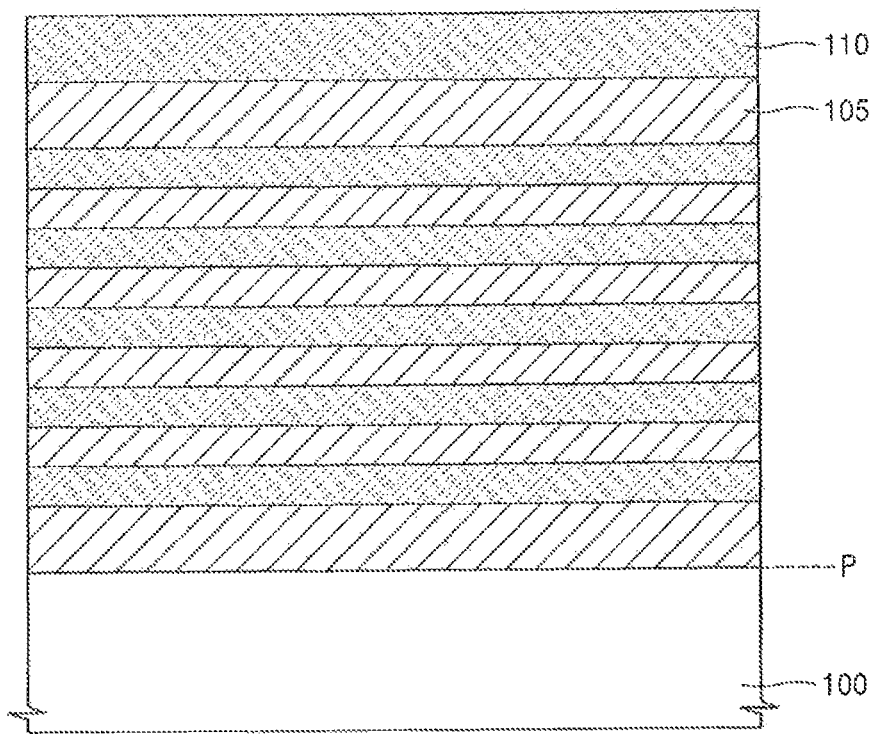
FIGS. 16 through 29 are sectional views illustrating a method of fabricating the non-volatile memory device shown in FIGS. 1 and 14A through 14D.

Referring to FIG. 16, the sacrificing layers 105 and the insulation layers 110 may be alternately and sequentially stacked on the semiconductor substrate 100. The sacrificing layer 105 may be formed on the semiconductor substrate 100 as the bottommost layer. The insulation layer 110 may be stacked as the topmost layer. The sacrificing layers 105 may be stacked corresponding to the number of the string selecting transistors SST, ground selecting transistors GST, and the memory cells MC1 through MCn which constitute the cell string units 11 of FIGS. 1 and 14A through 14D. The sacrificing layers 105 may contain a material having an etching selectivity with respect to the insulation layers 110. The insulation layers 110 may include silicon oxide layers, and the sacrificing layers 105 may include silicon nitride layers. The sacrificing layers 110 may include silicon oxide layers, and the insulation layers 110 may include silicon nitride layers.

Figure 17:
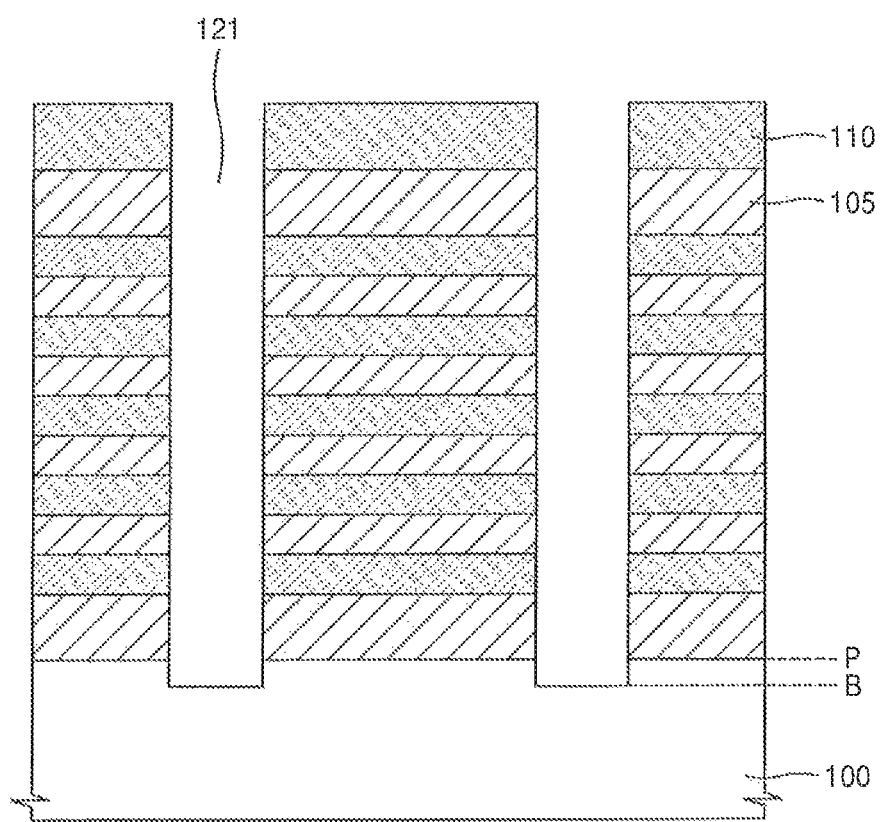

Referring to FIG. 17, a mask pattern (not shown) for defining channel regions may be formed on the semiconductor substrate 100. The first openings 121, which define the channel regions in the sacrificing layers 105 and the insulation layers 110, may be formed by etching the sacrificing layers 105 and the insulation layers 110 by using the mask pattern as an etching mask. The first openings 121 may expose the first portions of the semiconductor substrate 100. The mask pattern may be removed. The first portions of the semiconductor substrate 100 exposed through the first openings 121 may be further etched to a predetermined depth. Therefore, position B of top surface on the first portions may be lower than position P of top surface of initial substrate 100.

Figure 18:
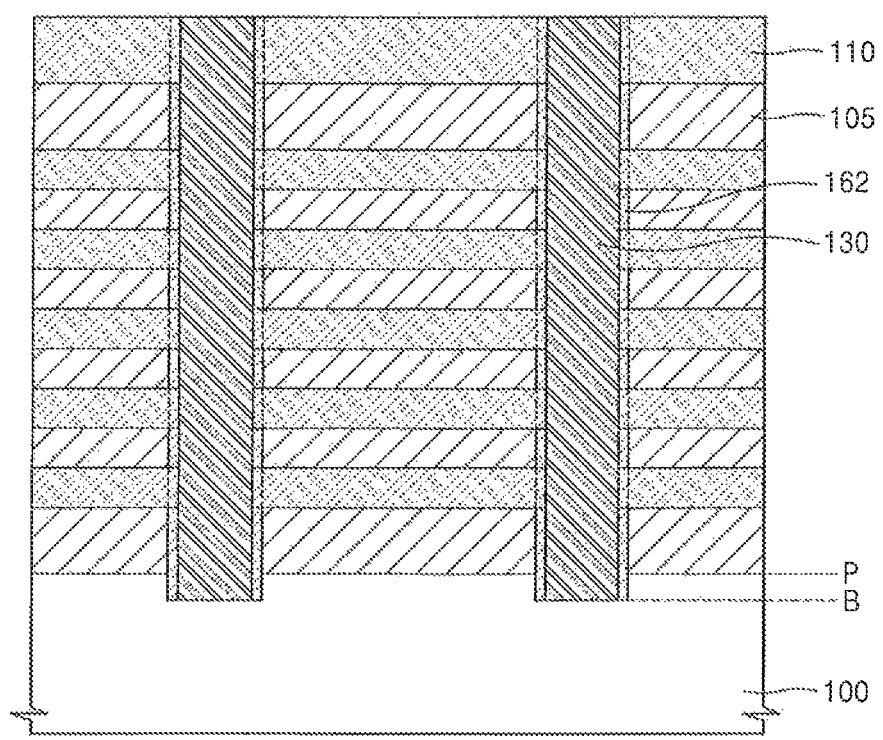

Referring to FIG. 18, protective layers 162 may be formed on the sidewalls of the first openings 121, and the channel layers 130 may be formed between the protective layers 162. The channel layers 130 may be formed to contact the first portions of the semiconductor substrate 100 via the first openings 121

The protective layers 162 may protect the channel layers 130 when the sacrifice layers 105 are etched in a later operation. Therefore, the lower portions of the protective layers 162 may extend to position B at which the channel layers 130 contact the semiconductor substrate 100. Furthermore, the protective layers 162 may be formed of the same material as the insulation layers 110. Therefore, the protective layers 162 may protect the channel layers 130 when the sacrifice layers 105 are removed. The protective layers 162 may be formed of a material having an etching selectivity different from that of the material constituting the insulation layer 110 for easy removal. However, since the thickness of the protective layers 162 is small, the protective layers 162 may be easily removed even if the protective layers 162 are formed of the same material as the insulation layers 110.

The protective layers 162 may also function as gate dielectric layers. Therefore, as described above, the protective layers 162 may include charge tunnelling layers, charge storage layers, and charge blocking layers. For example, the protective layers 162 may be formed of oxide-nitride-alumina (ONA) or oxide-nitride-oxide-alumina (ONOA). If the protective layers 162 functions as gate dielectric layers, an operation of forming gate dielectric layers after removal of the sacrifice layers 105 may be omitted, Detailed descriptions thereof will be given below with reference to FIGS. 30 and 31.

Each of the channel layers 130 may include a semiconductor layer. The channel layers 130 may be formed by filling the first openings 121 between the protective layers 162 with undoped poly-silicon. After the poly-silicon gap filling operation, a CMP operation or an etchback operation may be performed.

Figure 19:
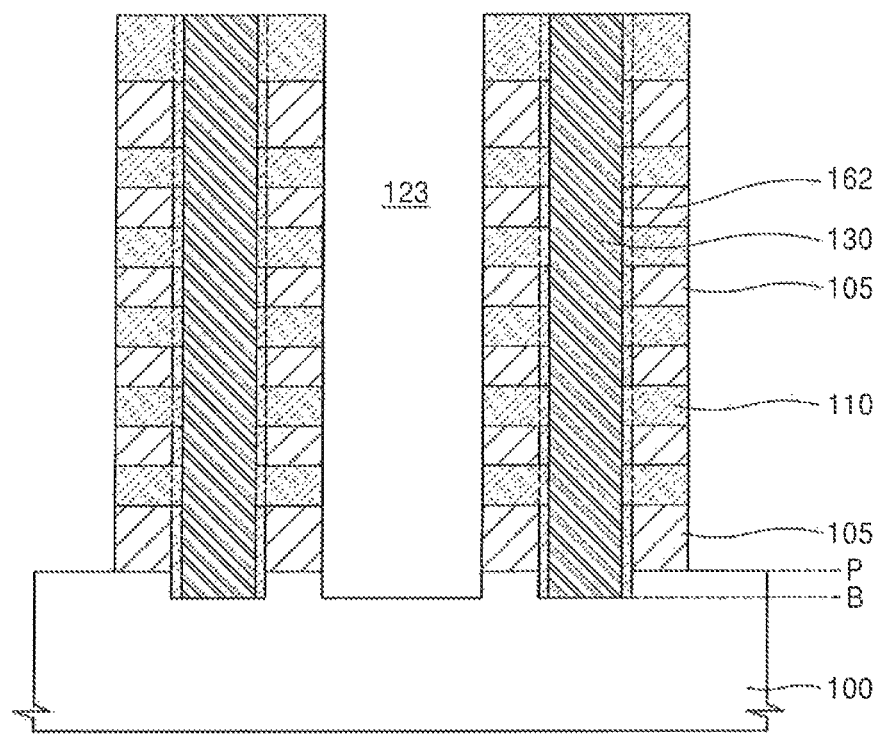

Referring to FIG. 19, a photosensitive layer (not shown) may be formed on the topmost insulation layer 110, the channel layers 130, and the conductive layers 135. The photosensitive layer may expose portions of the topmost insulation layer 110 corresponding to the second portions of the semiconductor substrate 100. The second portions of the semiconductor substrates 100 may include portions on which common source regions are to be formed. The second openings 123, which expose the second portions of the semiconductor substrate 100, may be formed by etching the insulation layers 110 and the sacrificing layers 105 by using the photosensitive layer as an etching mask. Side surfaces of the sacrificing layers 105 and the insulation layers 110 may be exposed through the second openings 123.

Figure 20:
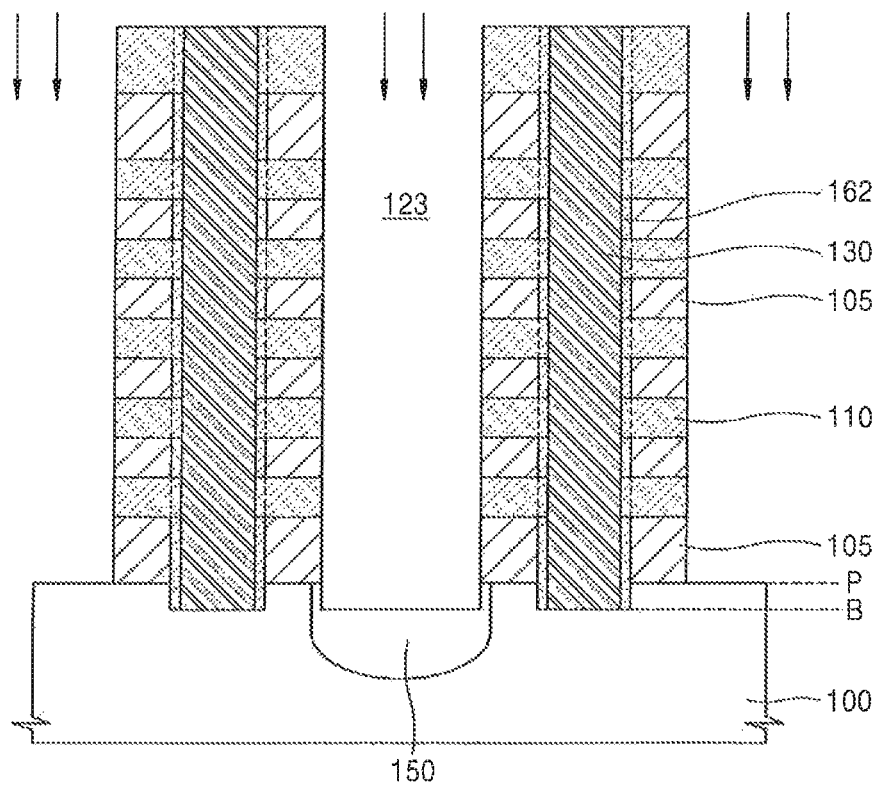

Referring to FIG. 20, the impurity regions 150 may be formed on the second portions of the semiconductor substrate 100 by ion-implanting N– type impurities into the second portions of the semiconductor substrate 100 exposed through the second openings 123.

Figure 21:
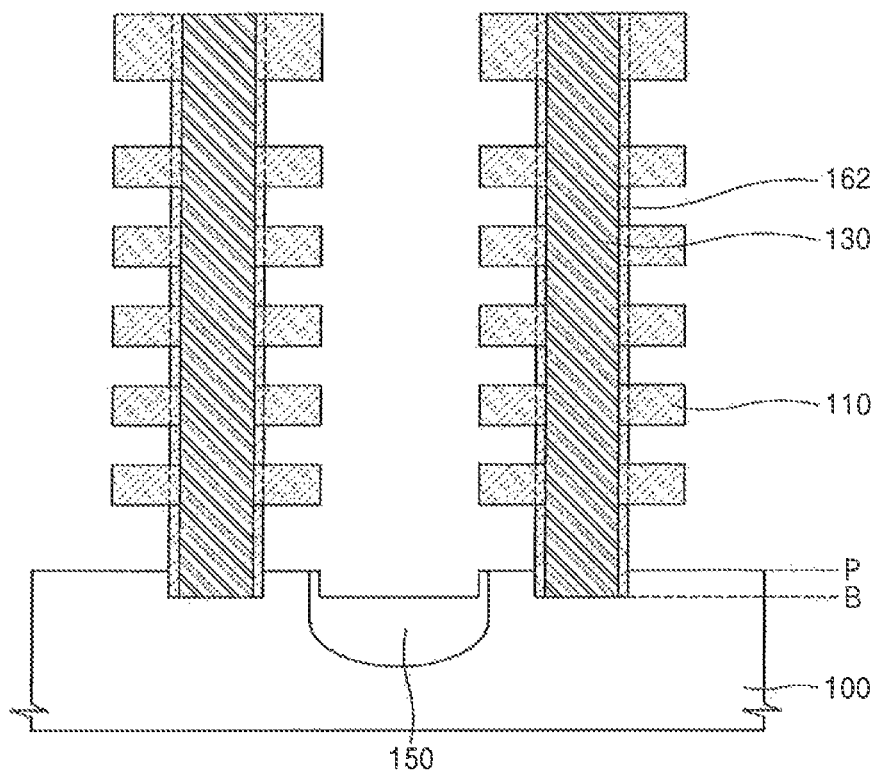

Referring to FIG. 21, the sacrificing layers 105 exposed through the second openings 123 may be removed by using wet-etching. Upon removing the sacrificing layers 105, the side openings 127, which extend at two opposite sides of the second openings 123, may be formed. The side openings 127 may expose portions of the protective layers 162 and third portions of the semiconductor substrate 100 in two opposite sides of the impurity regions 150. The side openings 127 may define gate forming areas to be formed in a later operation.

As shown in FIG. 21, the lower portions of the protective layers 162 are not exposed even after the sacrifice layers 105 are removed. Therefore, in this case, if the protective layers 162 are removed, the unexposed lower portions of the protective layers 162 remain, and the remaining lower portions of the protective layers 162 increases the distance between the source region and the channel layers. Therefore, inversion control cannot be performed, and thus channel disconnection below a selecting transistor may occur, Therefore, it is important to remove the unexposed lower portions of the protective layers 162.

Figure 22:
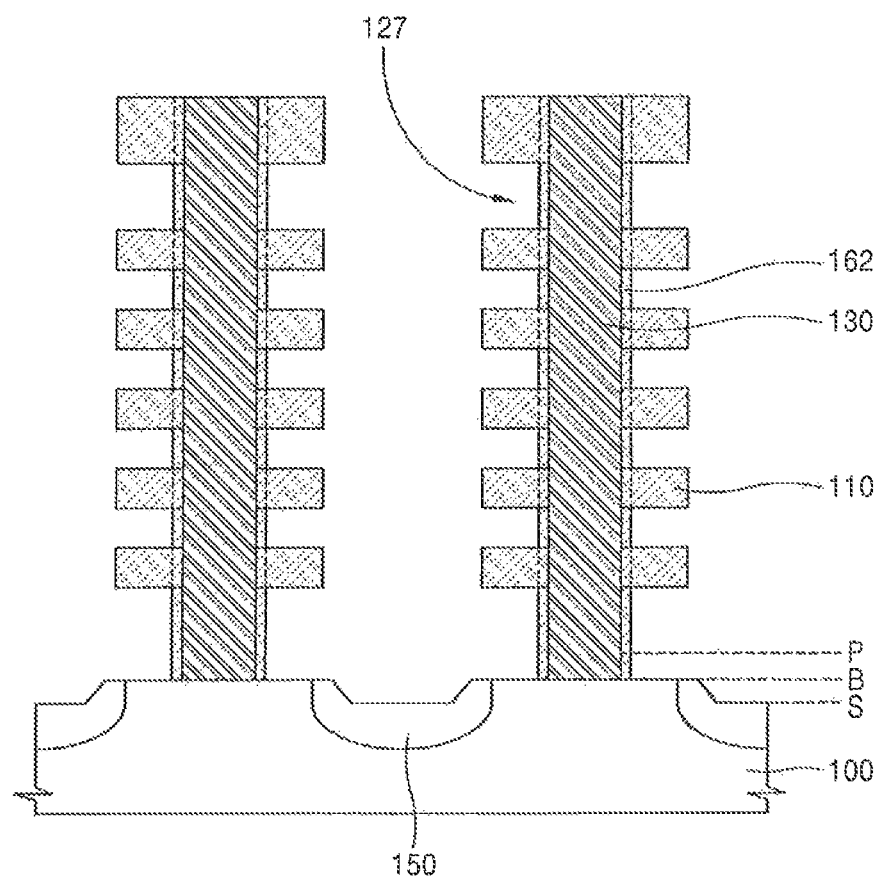

Referring to FIG. 22, wet-etching is further performed with respect to the semiconductor substrate 100 to remove the unexposed lower portions of the protective layers 162. Due to the wet-etching with respect to the semiconductor substrate 100, the lower portions of the protective layers 162 are completely exposed toward the sides of the side openings 127. Here, when the semiconductor substrate 100 is wet-etched, the protective layers 162 prevent sides of the channel layers 130 from being etched. After the semiconductor substrate 100 is further etched, position S of the top surface of the center of the impurity region is lower than the position of an end of the protective layers 162, that is, position B at which the channel layers 130 and the semiconductor substrate 100 contact each other.

Figure 23:
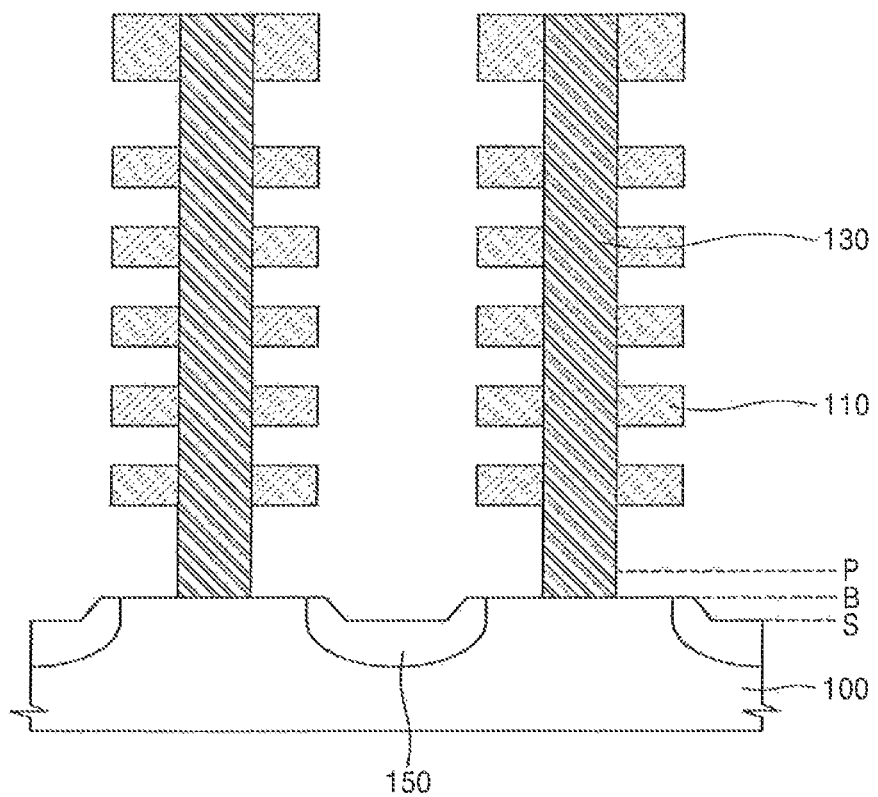

Referring to FIG. 23, the portions of the protective layers 162 exposed toward the sides of the side openings 127 are removed by using wet-etching, and thus portions of the channel layers 130 are exposed toward the sides of the side openings 127. As described above, in the case where the protective layers 162 are formed of the same material as the insulation layers 110, the protective layers 162 may be removed due to the thickness difference. Therefore, in the case where the protective layers 162 are formed of the same material as the insulation layers 110, the insulation layer 110 may be etched by the thickness of the protective layers 162, and thus the size of the insulation layer 110 may decrease, unlike the embodiment shown in FIG. 23. In the case where the protective layers 162 are used as gate dielectric layers, the protective layers 162 may not be etched.

Figure 24:
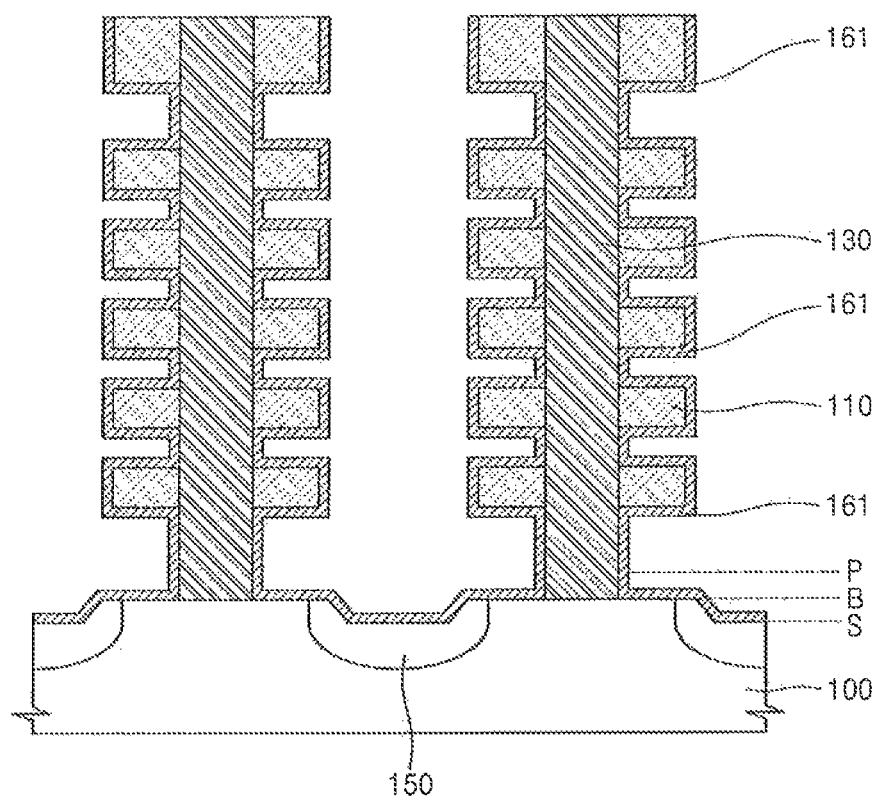

Referring to FIG. 24, a dielectric layer 161 may be formed on the channel layers 130, the insulation layers 110, and the second and third portions of the semiconductor substrate 100, which are exposed through the side openings 127 and the second openings 123.

Figure 25:
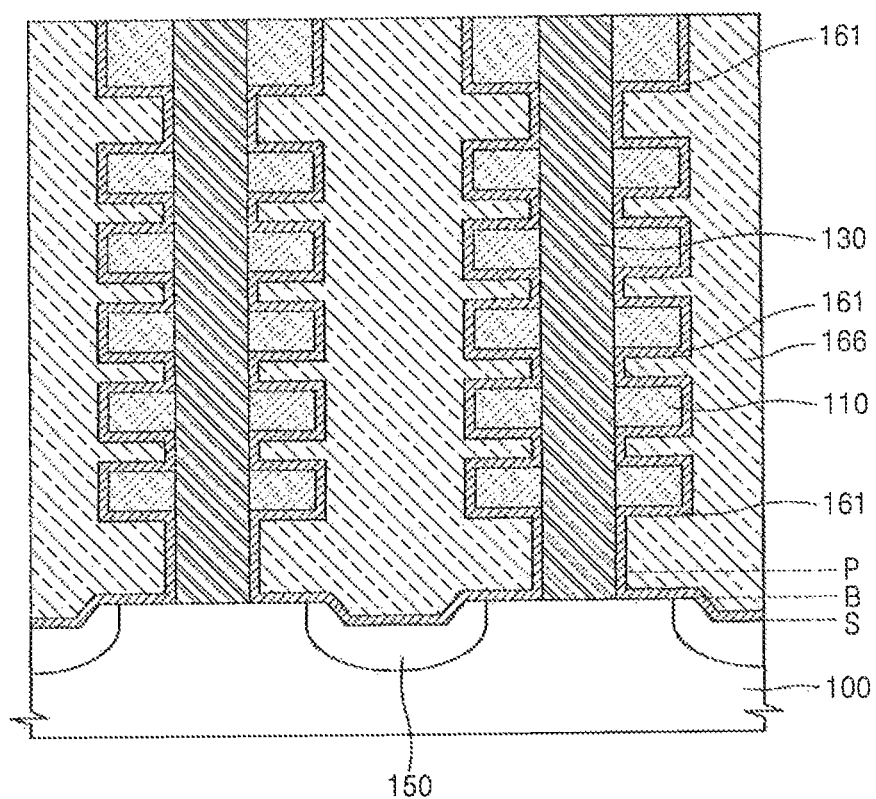

Referring to FIG. 25, a conductive layer 166 may be formed on the dielectric layer 161 such that the side openings 127 and the second openings 123 are completely filled. After the operation of filling the side openings 127 and the second openings 123, a CMP operation or an etchback operation may be performed.

Figure 26:
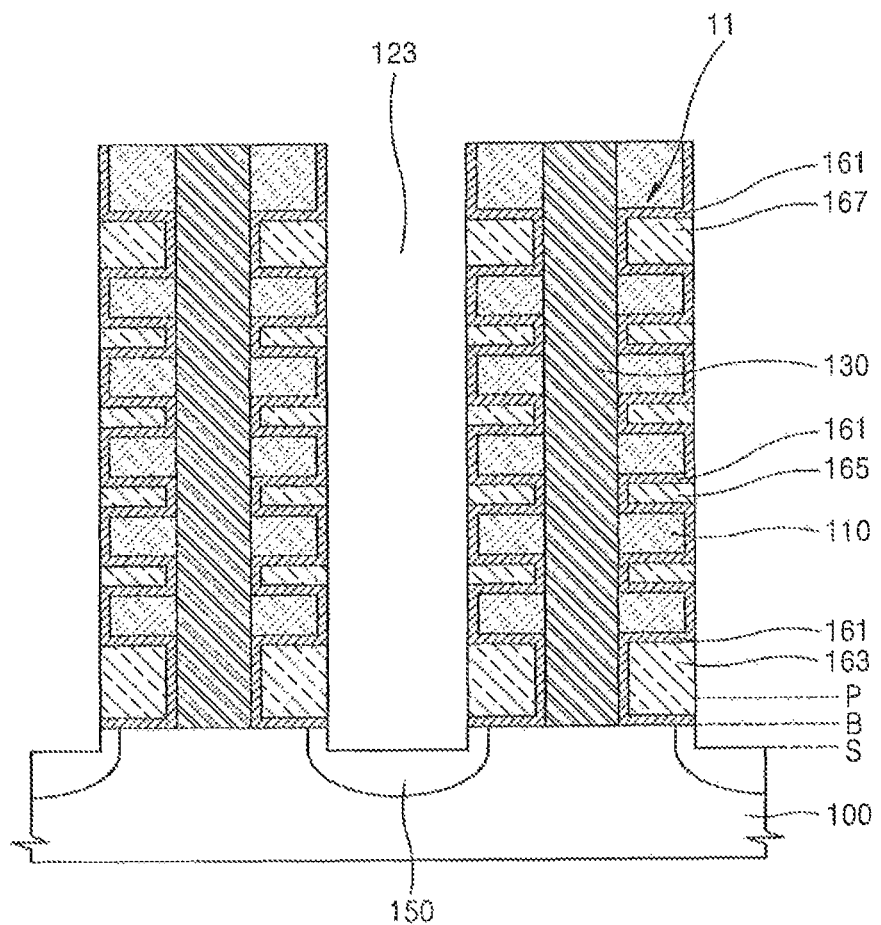

Referring to FIG. 26, the conductive layer 166 is etched to separate gates from each other and to form openings exposing the second portions of the semiconductor substrate 100. Here, the position and the structure of the openings are substantially identical to those of the second openings described above. Therefore, the openings will be hereinafter referred to as the second openings.

The gate dielectric layers 161 and the gates 163, 165, and 167 that are arranged in the side openings 127 may be formed by forming the second openings 123. The gate dielectric layers 161 may be arranged on bottom surfaces and side surfaces of the side openings 127, and the gates 163, 165, and 167 may be formed on the gate dielectric layers 161 such that the gates 163, 165, and 167 are completely buried in the side openings 127. The dielectric layers 161 on the side surfaces of the second openings may also be removed during etching operation.

The bottommost gates 163 may include gates of the ground selecting transistors GST of the cell string units 11 of FIG. 1, and the topmost gates 167 may include gates of the string selecting transistor SST. The gates 165 arranged between the gates 163 and 167 may include control gates of the memory cells MC1 through MCn. Each of the gate dielectric layers 161 may include a tunnelling layer, a charge storage layer, and a charge blocking layer, Each of the gate dielectric layers 161 may include oxide-nitride-alumina (ONA) or oxide-nitride-oxide-alumina (ONOA). The gates 163, 165, and 167 may include metal layers, such as tungsten layers, and barrier layers.

Figure 27:
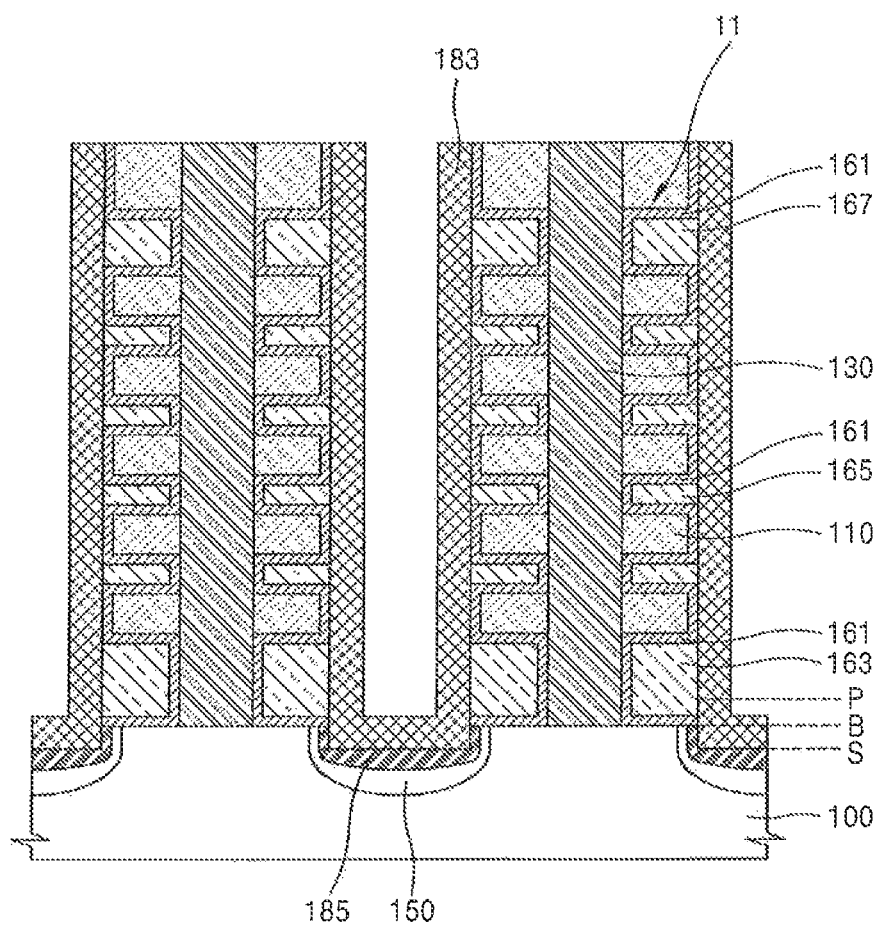

Referring to FIG. 27, metal layers 183, which are arranged on the sidewalls and the bottom surfaces of the second openings 123, may be formed on the second portions of the semiconductor substrate 100, that is, the impurity regions. The metal layers 183 may be formed of, for example, cobalt (Co). After the metal layers 183 are formed, the metal silicide layers 185 are formed by silicidizing portions of the metal layers 183 contacting the impurity regions through predetermined thermal processing. As described above, the metal silicide layers 185, e.g., cobalt silicide ($CoSi_x$) layers, function as the common source line. N+ type impurities may be ion-implanted prior to the formation of the metal layers 183, so that each of the impurity regions 150 may include an N+ type high concentration impurity region and N− type low concentration impurity regions that are arranged on two opposite sides of the high concentration impurity region. In this case, the impurities ion-implanted in FIG. 20 may be N− type impurities.

Figure 28:
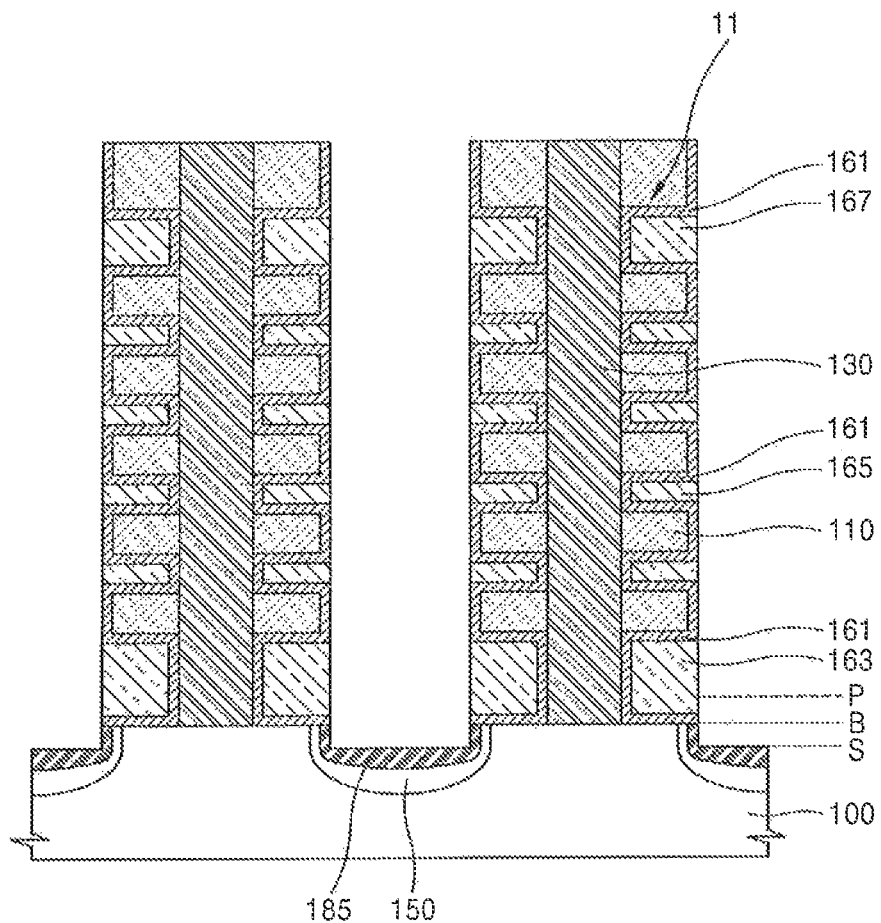

Referring to FIG. 28, the metal layers 183 remaining on the cobalt silicide ($CoSi_x$) layers are removed by using wet-etching.

Referring to FIG. 29, the insulation layers 175, which are filled in the second openings 123, are formed after the metal layers 183 are removed. The insulation layers 175 may be formed of oxide, such as BPSG. After the insulation layers 175 are formed, an etchback operation or a CMP operation may be performed. Next, after forming at least one oxide-type interlayer insulation layer (not shown) on the entire substrate and forming metal contacts (not shown), which expose portions of the channel layers 130, the bitlines 190 may be formed. The bitlines 190 contact the portions of the channel layers 130 via the metal contacts.

Although a method of fabricating the structure shown in FIG. 14A is described above, the inventive concept is not limited thereto. For example, one or a combination of the process fabricating the structures shown in FIGS. 2A through 2D and the process fabricating the structure shown in FIG. 14A may be suitably performed to fabricate the structures shown in FIGS. 14B through 14D.

Figure 30:
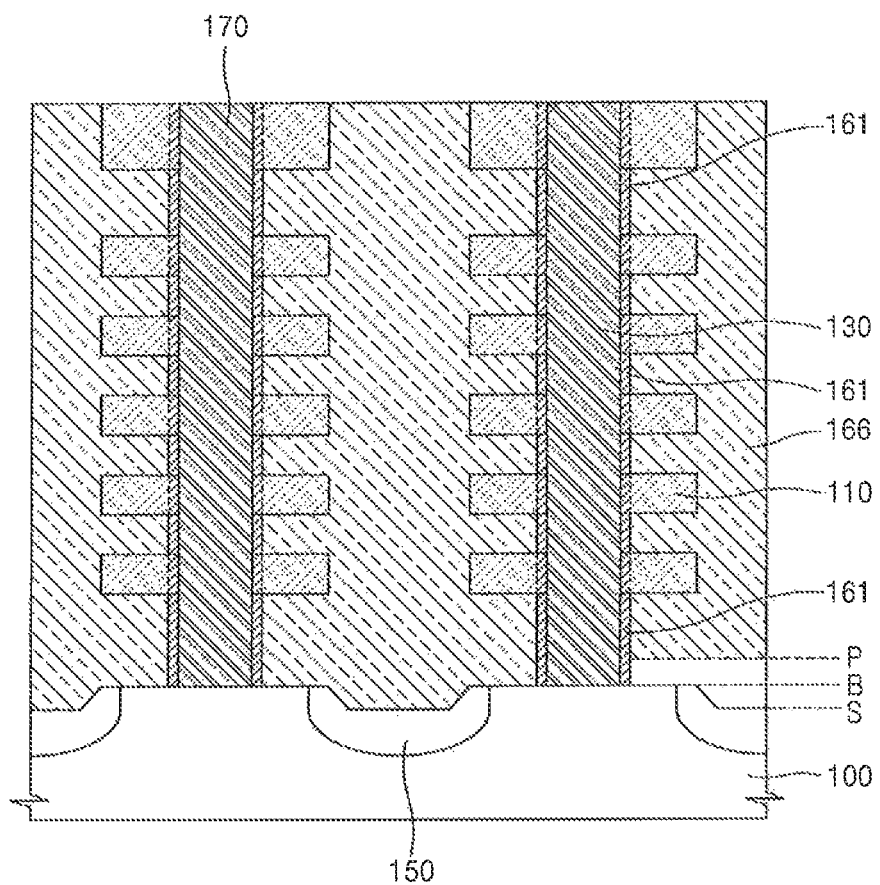
FIGS. 30 and 31 are sectional views illustrating a method of fabricating the non-volatile memory device shown in FIGS. 1 and 15.
Figure 31:
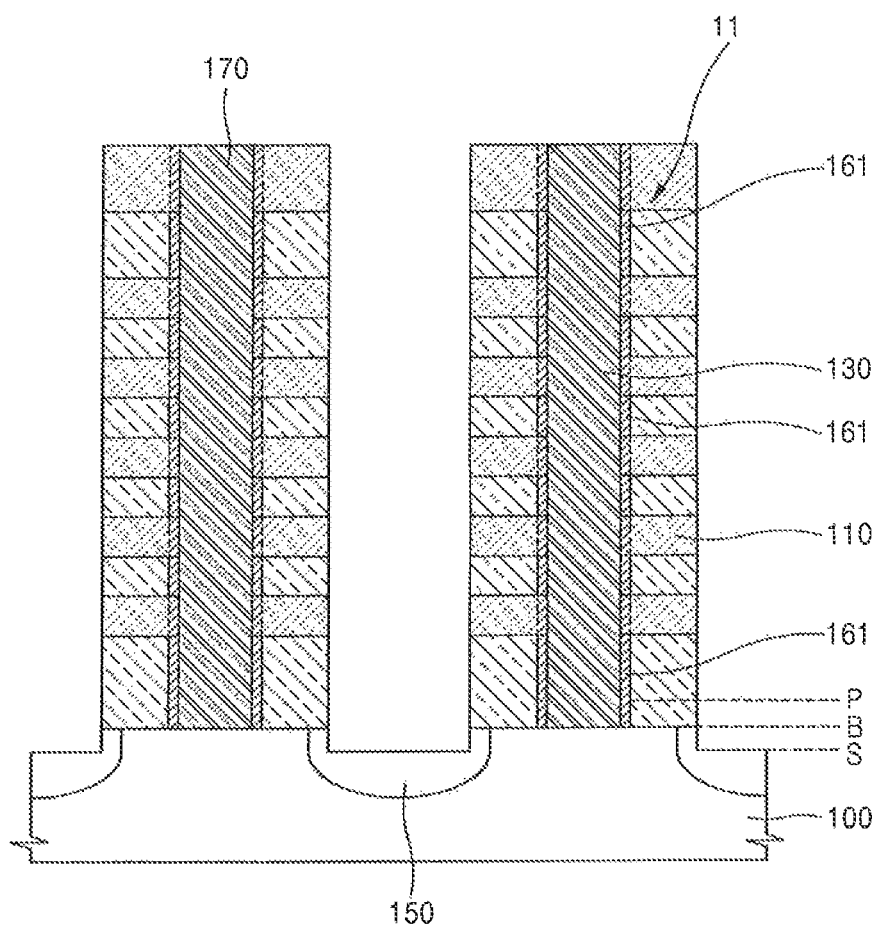

FIGS. 30 and 31 are sectional views illustrating a method of fabricating the non-volatile memory device shown in FIGS. 1 and 15. Here, the operations shown in FIGS. 16 through 22 for fabricating the structure shown in FIG. 14A are identically applied to the present embodiment, and thus the detailed descriptions will be omitted. In FIG. 18, the protective layers 162 may include charge tunnelling layers, charge storage layers, and charge blocking layers to function as gate dielectric layers. For example, the protective layers 162 may be formed of oxide-nitride-alumina ("ONA") or oxide-nitride-oxide-alumina ("ONOA").

Referring to FIG. 30, the conductive layer 166 may be formed on the dielectric layer 161 such that the side openings 127 and the second openings 123 are completely filled. After the operation of filling the side openings 127 and the second openings 123, a CMP operation or an etchback operation may be performed. In other words, the operation for removing exposed protective layers as shown in FIG. 23 and the operation for forming dielectric layers as shown in FIG. 24 are omitted. Since the protective layers 162 function as dielectric layers, it is not necessary to form additional dielectric layers. The protective layers 162 are indicated as the gate dielectric layers 161.

Referring to FIG. 31, the conductive layer 166 is etched to separate gates from each other and to form openings for exposing the second portions of the semiconductor substrate 100. Here, the position and the structure of the openings are substantially identical to those of the second openings described above. The subsequent operations are identical to the operations shown in FIGS. 27 through 29, and thus the detailed descriptions will be omitted. After the operations shown in FIGS. 27 through 29 are performed, a non-volatile memory device as shown in FIG. 15 may be embodied.

Figure 32:
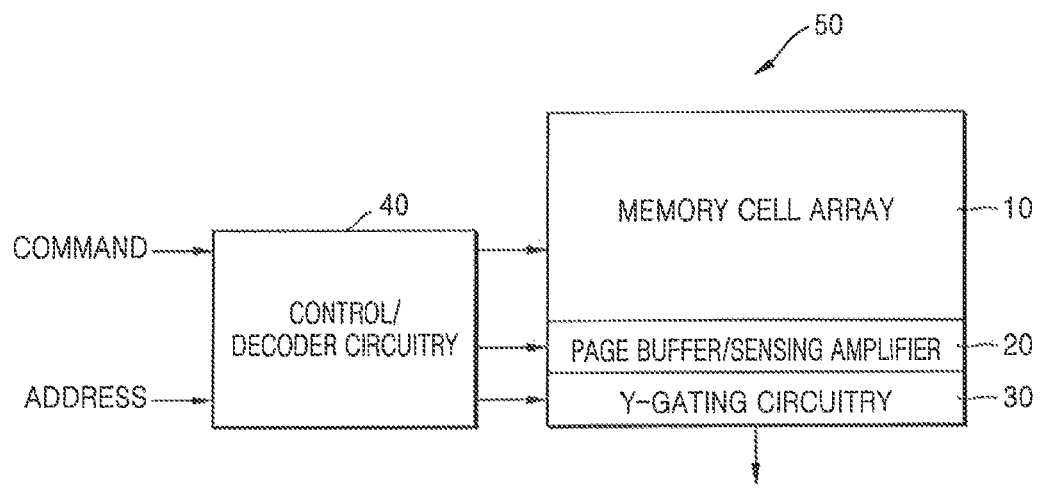
FIG. 32 is a block diagram of a non-volatile memory device according to an embodiment of the inventive concept.

FIG. 32 is a block diagram of a non-volatile memory device according to an embodiment of the inventive concept.

Referring to FIG. 32, a non-volatile memory device 50 may include a memory cell array 10, a page buffer 20, Y-gating circuitry 30, and control/decoder circuitry 40.

The memory cell array 10 may be the non-volatile memory device of FIGS. 2A through 2D. The page buffer 20 may amplify data, which is either to be recorded to the memory cell array 10 or read out from the memory cell array 10, and temporarily store the amplified data.

The Y-gating circuitry 30 may transmit data stored in the page buffer 20. The control/decoder circuitry 40 may receive an external input command (CMD) and an address, output a control signal for writing data to the memory cell array 10 or reading out data from the memory cell array 10, and decode the address. The control/decoder circuitry 40 may provide driving signals to the string selecting line SSL, ground selecting line GSL, and the wordlines WL1 through WLn of FIG. 1. The control/decoder circuitry 40 may output a control signal for data input/output to the page buffer 20, and may provide address information to the Y-gating circuitry 30.

Figure 33:
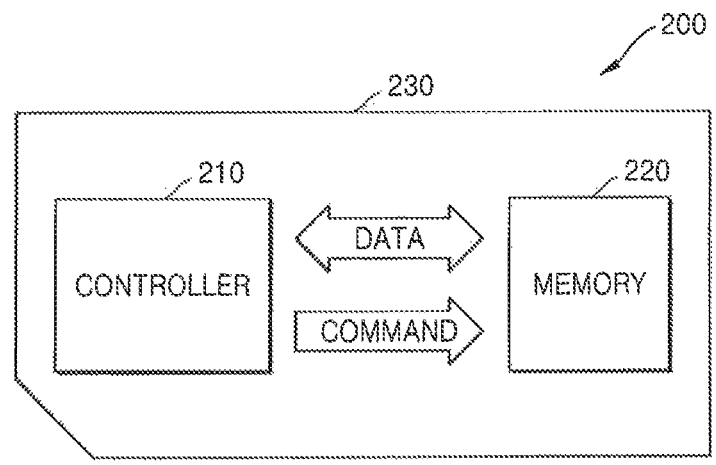
FIG. 33 is a block diagram of a memory card according to an embodiment of the inventive concept.

FIG. 33 is a block diagram of a memory card according to an embodiment of the inventive concept.

Referring to FIG. 33, a memory card 200 may include a controller 210, a memory 220, and a housing 230, wherein the controller 210 and the memory 220 are arranged in the housing 230. The controller 210 and the memory 220 may exchange electric signals. For example, in response to an instruction from the controller 210, the memory 220 and the controller 210 may transmit and receive data. Thus, the memory card 200 may store data in the memory 220 or output data from the memory 220. The memory 220 may be the non-volatile memory device of FIGS. 2A through 2D.

The memory card 200 may be used as a data storage medium for various portable apparatuses. For example, the memory card 220 may be a memory stick ("MS") card, a smart media ("SM") card, a secure digital ("SD") card, a mini SD card, or a multimedia card ("MMC").

Figure 34:
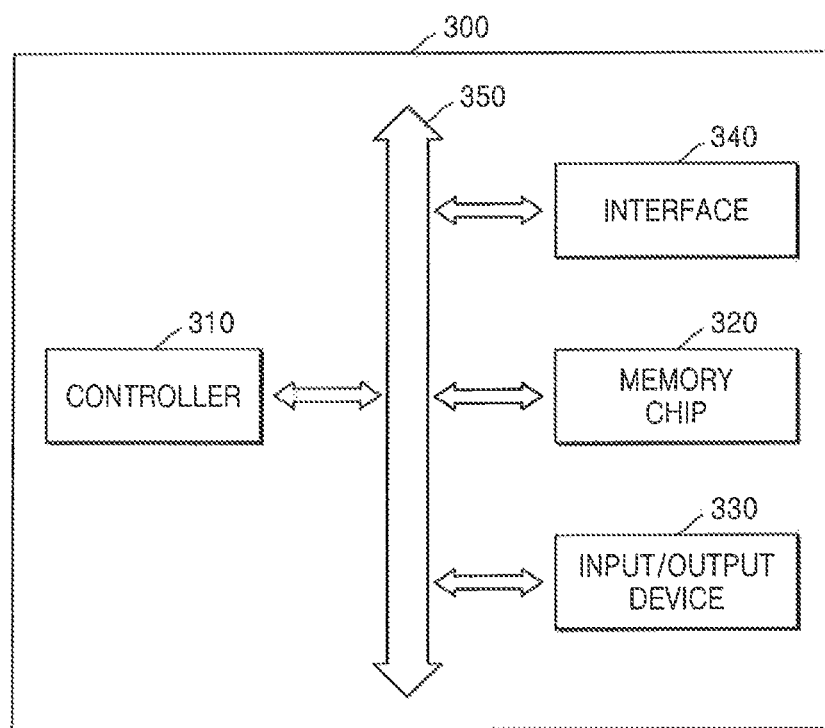
FIG. 34 is a block diagram of an electronic system according to an embodiment of the inventive concept.

FIG. 34 is a block diagram of an electronic system according to an embodiment of the inventive concept.

Referring to FIG. 34, an electronic system 300 may include a controller 310, a memory chip 320, an input/output device 330, and an interface 340. The controller 310 may execute programs and control the input/output device 330 and the memory chip 320. The memory chip 320 may include the non-volatile memory device of FIGS. 2A through 2D. The input/output device may be used for data input/output between an external apparatus, such as a personal computer or a network, and the electronic system 300. The interface 340 may be used to interface between the electronic system 300 and an external apparatus (not shown). The controller 310, the memory chip 320, the input/output device 330, and the interface 340 may perform data communication with each other via a bus 350.

For example, the electronic system 300 may be used in various electronic control devices which require the memory chip 320, such as e.g., mobile phones, MP3 players, navigators, solid state disks ("SSD"), or household appliances.

While the inventive concept has been particularly shown and described with reference to exemplary embodiments thereof, it will be understood that various changes in form and details may be made therein without departing from the spirit and scope of the following claims.

What is claimed is:

1. A method of fabricating a vertical non-volatile memory device, the method comprising:
    forming a stack structure by alternately stacking first material layers and second material layers on a semiconductor substrate;
    forming vertical structures penetrating the stack structure on first portions of the semiconductor substrate to be apart from each other, wherein each of the vertical structures comprises a first insulation pillar and a channel layer disposed on side and bottom surfaces of the first insulation pillar;
    forming first openings that expose second portions of the semiconductor substrate between the first portions of the semiconductor substrate;
    forming spacers on side surfaces of the first openings; and
    forming conductive lines on the second portions of the semiconductor substrate between the spacers,
    wherein each of the second portions of the semiconductor substrate comprises an impurity region.

2. The method of claim 1, wherein the vertical structures extend vertically with respect to a top surface of the semiconductor substrate.

3. The method of claim 1, further comprising:
    forming first pillars on the conductive lines inside the first openings, wherein the first pillars are formed of a material different from that of the conductive lines.

4. The method of claim 1, wherein the impurity region comprises an N-type impurity region.

5. The method of claim 1, further comprising:
    forming metal silicide layers on the impurity regions before the conductive lines are formed.

6. The method of claim 5, wherein the conductive lines are formed by selectively depositing metal layers onto the metal silicide layers.

7. The method of claim 1, wherein the conductive lines are formed of a metal selected from among tungsten (W), aluminum (Al), and copper (Cu).

8. The method of claim 1, further comprising:
    forming gates of selecting transistors and gates of memory cell transistors that are arranged between the gates of the selecting transistors before the spacers are formed, wherein the gates of selecting transistors and memory cell transistors are arranged on the vertical structures and are vertically stacked with respect to a top surface of the semiconductor substrate.

9. The method of claim 8, wherein the conductive lines are formed to be located lower than bottom surfaces of the bottommost gates from among the gates of the memory cell transistors.

10. The method of claim 1, wherein the impurity regions are formed by ion-implanting impurities to portions of the semiconductor substrate exposed through the first openings, and wherein forming the conductive lines comprises:
    forming metal layers on the impurity regions between the spacers, and
    forming first pillars that fill the first openings on the metal layers.

* * * * *